(12) United States Patent
Seebacher et al.

(10) Patent No.: US 9,099,996 B2
(45) Date of Patent: Aug. 4, 2015

(54) METHODS AND DEVICES FOR PROVIDING CROSS POINT INFORMATION

(71) Applicant: Infineon Technologies AG, Neubiberg (DE)

(72) Inventors: David Seebacher, Villach (AT); Peter Singerl, Villach (AT); Christian Schuberth, Villach-Landskron (AT); Martin Mataln, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/079,923

(22) Filed: Nov. 14, 2013

(65) Prior Publication Data

US 2015/0130549 A1    May 14, 2015

(51) Int. Cl.
*H03K 7/08*    (2006.01)

(52) U.S. Cl.
CPC .......................................... *H03K 7/08* (2013.01)

(58) Field of Classification Search
USPC .......................................... 332/109; 375/238
See application file for complete search history.

(56) References Cited

U.S. PATENT DOCUMENTS

| 7,307,488 B2 * | 12/2007 | Pedersen et al. | 332/109 |
| 2010/0073102 A1 * | 3/2010 | Singerl et al. | 332/108 |

OTHER PUBLICATIONS

Nuyts, P.A.J., et al., "A Fully Digital Delay Line Based GHz Range Multimode Transmitter Front-End in 65-nm CMOS." IEEE Journal of Solid-State Circuits, Jul. 2012, pp. 1681-1692, vol. 47, No. 7, IEEE Solid-State Circuits Society.

Ravi, A., et al., "A 2.4-GHz 20-40-MHz Channel WLAN Digital Outphasing Transmitter Utilizing a DelayBased Wideband Phase Modulator in 32-nm CMOS." IEEE Jounal of Solid-State Circuits, Dec. 2012, pp. 3184-3196, vol. 47, No. 12. IEEE Solid-State Circuits Society.

Goldberg, J.M., et al., "Pseudo-Natural Pulse Width Modulation for High Accuracy Digital-To-Analogue Conversion." Electronic Letters, Aug. 1991, pp. 1491-1492, vol. 27, No. 16, Institution of Engineering and Technology.

Goldberg, J.M., et al., "New High Accuracy Pulse Width Modulation based Digital-to-Analogue Converter/Power Amplifier." IEE Proceedings—Circuits, Devices, and Systems, Aug. 1994, pp. 315-324, vol. 141, No. 4, Institution of Engineering and Technology.

* cited by examiner

*Primary Examiner* — Joseph Chang
(74) *Attorney, Agent, or Firm* — Murphy, Bilak & Homiller, PLLC

(57) ABSTRACT

A method for providing cross point information includes: providing an input signal having amplitude and phase information; interpolating between a first point of the input signal and a second point of the input signal to provide cross point information between the first point and the second point; and providing a pulse-width modulated signal based on the input signal and the cross point information.

20 Claims, 21 Drawing Sheets

METHODS AND DEVICES FOR PROVIDING CROSS POINT INFORMATION

TECHNICAL FIELD

The present disclosure described herein generally relates to techniques for estimating cross point information. In particular, the aspects of the present disclosure may relate to methods and devices applying cross point estimation in Radio Frequency Pulse Width Modulation (RF-PWM) modulators.

BACKGROUND

Pulse-width modulation (PWM), or pulse-duration modulation (PDM), is a modulation technique that may conform the width of the pulse, also called the pulse duration, based on modulator signal information. This modulation technique can be used to encode information for transmission, in particular for transmission over radio networks. The resulting spectrum usually may contain a dc component, a base sideband containing the modulating signal and phase modulated carriers at each harmonic of the frequency of the pulse. The amplitudes of the harmonic groups may be restricted by a $(\sin(x))/x$ envelope and may extend to infinity. The infinite bandwidth may be caused by the nonlinear operation of the pulse-width modulator. In consequence, a digital PWM may suffer from aliasing distortion that significantly reduces its applicability for modern communication systems. In particular, it may be desirable to reduce aliasing distortion in digital PWM.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. Like reference numerals designate corresponding similar parts.

DETAILED DESCRIPTION

In the following detailed description, reference is made to the accompanying drawings, which form a part thereof, and in which is shown by way of illustration specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present disclosure is defined by the appended claims.

The following terms, abbreviations and notations will be used herein:
CPE: Cross Point Estimation,
PWM: Pulse Width Modulation,
RF: Radio Frequency,
ZOH: Zero Order Hold,
CORDIC: Coordinate Rotation Digital Computer,
IQ: In-phase Quadrature,
LO: Local Oscillator,
PSD: Power Spectral Density,
ANA: Analog,
SNR: Signal to Noise Ratio,
NS: Noise Shaping,
BB: Baseband.

The methods and devices described herein may be based on pulse width modulation signals, in particular radio frequency pulse width modulation signals. It is understood that comments made in connection with a described method may also hold true for a corresponding device configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

The methods and devices described herein may be implemented in wireless communication networks, in particular communication networks based on 3G, 4G and CDMA standards. The methods and devices described below may further be implemented in a base station (NodeB, eNodeB) or a mobile device (or mobile station or User Equipment (UE)). The described devices may include integrated circuits and/or passives and may be manufactured according to various technologies. For example, the circuits may be designed as logic integrated circuits, analog integrated circuits, mixed signal integrated circuits, optical circuits, memory circuits and/or integrated passives.

The methods and devices described herein may be configured to transmit and/or receive radio signals. Radio signals may be or may include radio frequency signals radiated by a radio transmitting device (or radio transmitter or sender) with a radio frequency lying in a range of about 3 Hz to about 300 GHz. The frequency range may correspond to frequencies of alternating current electrical signals used to produce and detect radio waves.

The methods and devices described herein may be implemented in pulse width modulators, in particular radio frequency pulse width modulators as applied in radio communication systems, e.g. for transmitting the radio signal between a base station and a mobile device and vice versa.

Figure 1:
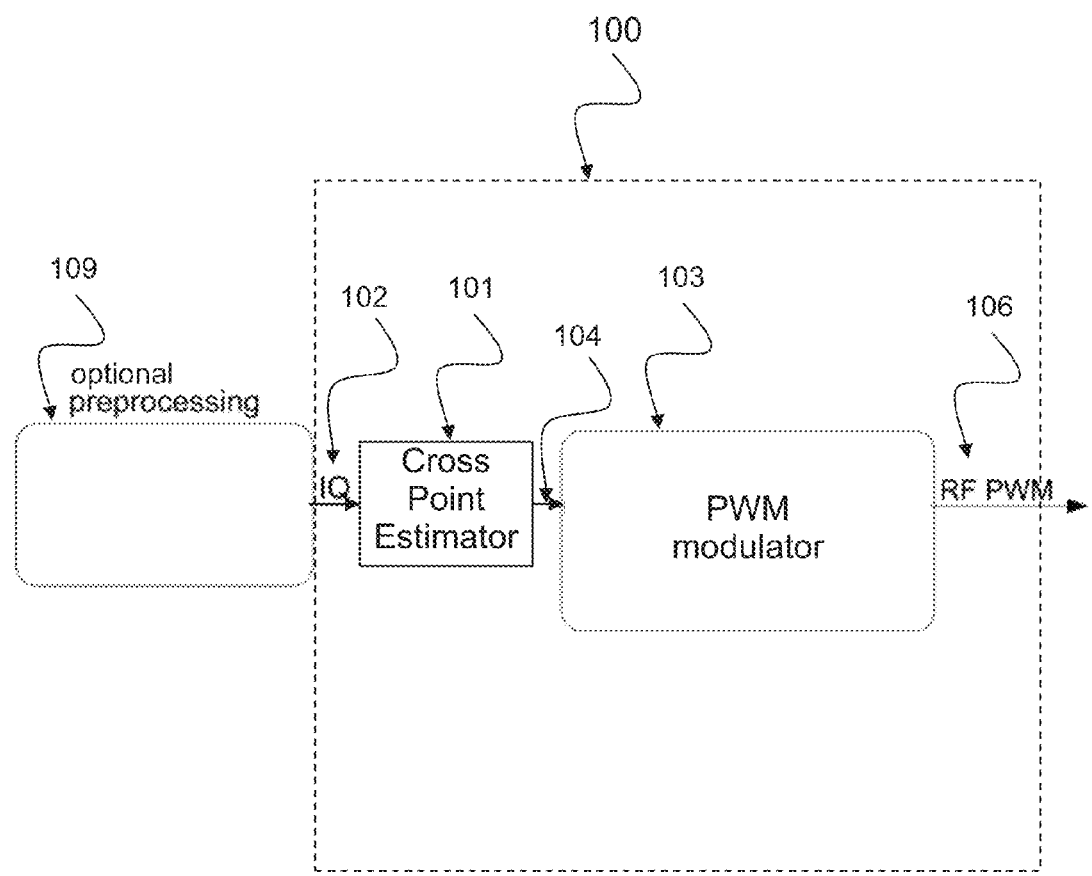
FIG. 1 is a block diagram illustrating a CPE (Cross Point Estimation) modulator in accordance with the disclosure.
Figure 15:
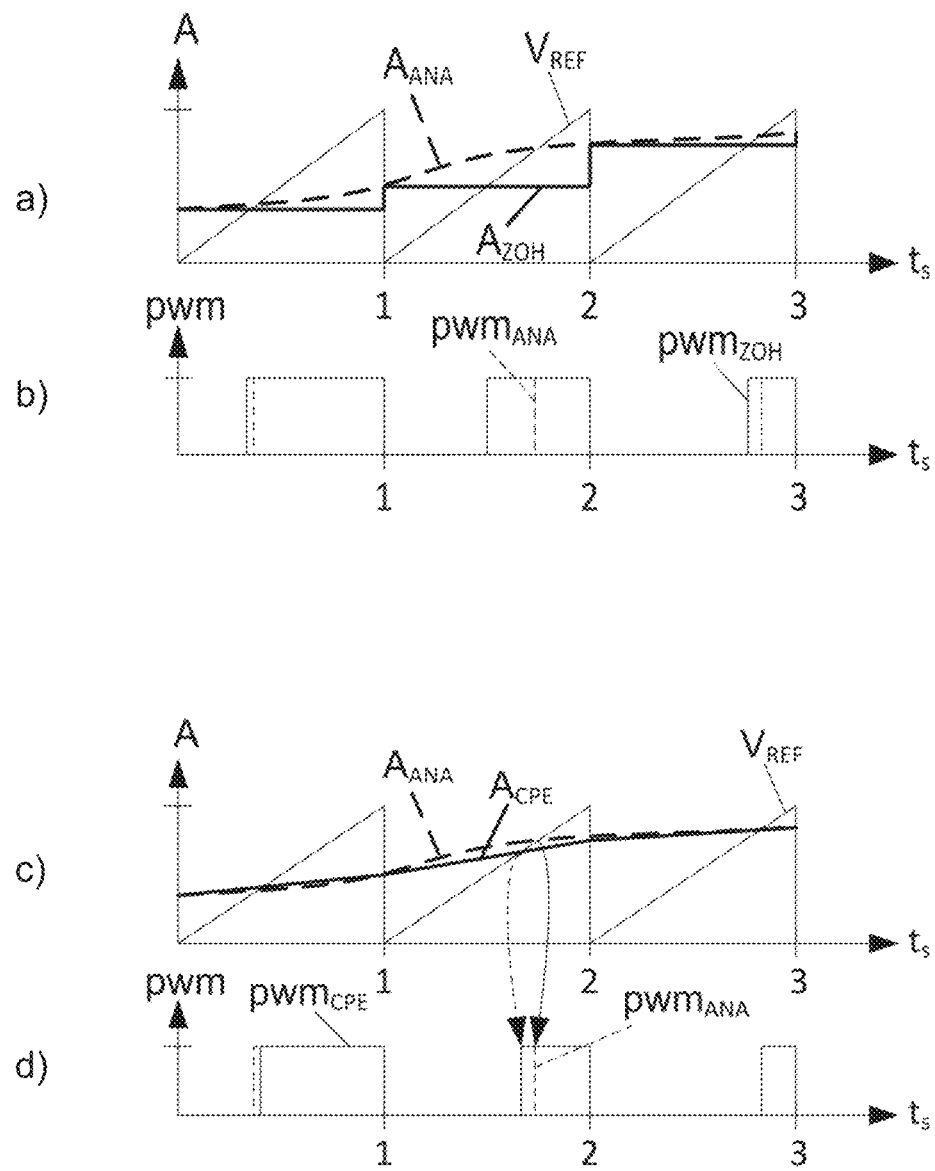
FIGS. 15a to 15d are schematic diagrams illustrating examples of analog (ANA), zero order hold (ZOH) and cross point estimation (CPE) PWM signal generation based on amplitude information only.

FIG. 1 is a block diagram illustrating a CPE (Cross Point Estimation) modulator 100 in accordance with the disclosure. The CPE modulator 100 may include a cross point estimator 101, i.e. a cross point estimation unit, to provide cross point information based on an IQ (in-phase quadrature) input signal 102. The cross point estimator 101 may provide a cross point (CP) corrected input signal 104 based on the IQ input signal 102 and the cross point information. In one example, the cross point information may be estimated according to a method as described below with respect to FIGS. 19 and 20. In one example, the cross point information may be estimated as described below with respect to FIGS. 15 and 16.

The CPE modulator 100 may include a PWM modulator unit 103 to modulate the CP corrected input signal 104 for providing a pulse width modulated output signal 106. The cross point information may be used to provide correction data for approximating a sampled IQ input signal 102 to its continuous time representation also denoted hereinafter as ideal representation.

The maximum update rate of the PWM modulator unit 103 may be limited by the carrier frequency. The PWM modulator unit 103 may perform an implicit zero order hold (ZOH) and may hold the value (for at least) one carrier period.

In one example, the PWM modulator unit 103 may be configured to provide a radio frequency (RF) signal as pulse width modulated output signal 106.

In one example, the PWM modulator unit 103 may include an optional delta sigma modulator as described below with respect to FIG. 8. The optional delta sigma modulator may receive the CP corrected input signal 104 and a feedback signal to provide a noise-shaped IQ signal. The delta sigma modulator may be used to shape the quantization noise.

In one example, an optional preprocessing unit 109, e.g. a preprocessing unit as described below with respect to FIG. 8, may be coupled to the CPE modulator 100 to provide the CPE modulator 100 with the input IQ signal 102, e.g. with a sampled version thereof.

In one example, the CPE modulator 100 may be implemented according to the description below with respect to FIGS. 8 to 12 and 21.

Figure 2:
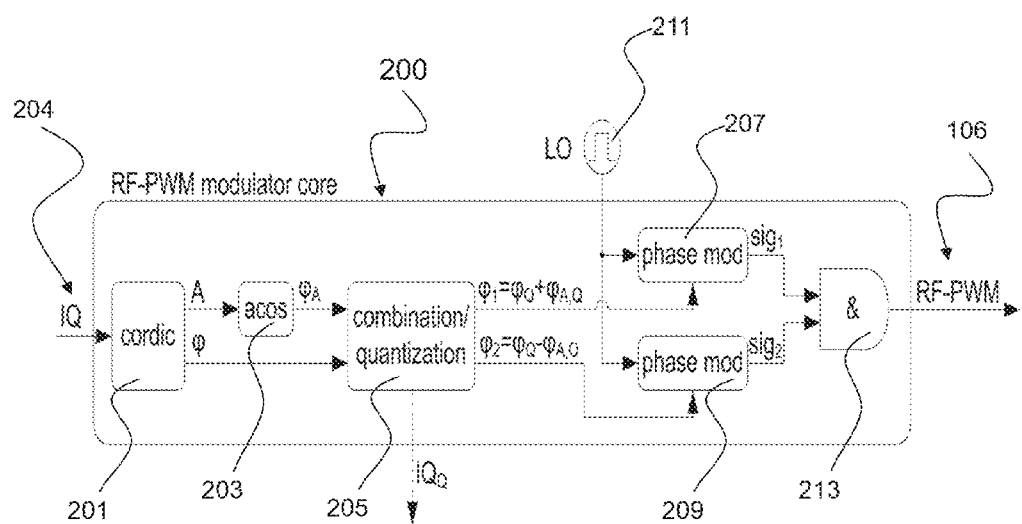
FIG. 2 is a block diagram illustrating an RF-PWM modulator core in accordance with the disclosure.

FIG. 2 is a block diagram illustrating an RF-PWM modulator core 200 in accordance with the disclosure. The RF-PWM modulator core 200 may correspond to the PWM modulator unit 103 as described above with respect to FIG. 1.

The IQ input signal 204 may be decomposed into phase ($\phi$) and amplitude (A) information by means of a CORDIC (Co-ordinate Rotation Digital Computer) 201. The outphasing signal $\phi_A$ may be calculated by applying an inverse cosine 203 to the amplitude signal A. The control signals $\phi_1$ and $\phi_2$ for the two phase modulators 207, 209 may include a quantized combination 205 of the phase signal $\phi$ and the outphasing signal TA. The RF-PWM signal 106 may be generated by applying a logical AND operation 213 to the two output signals $sig_1$ and $sig_n$ of the phase modulators 207, 209. Each phase modulator 207, 209 may perform a phase modulation of a local oscillator signal 211 based on the respective control signal $\phi_1$ and $\phi_2$ of the phase modulator 207, 209. The IQ input signal 204 may correspond to the cross point corrected IQ input signal 104 as described above with respect to FIG. 1.

Figure 3:
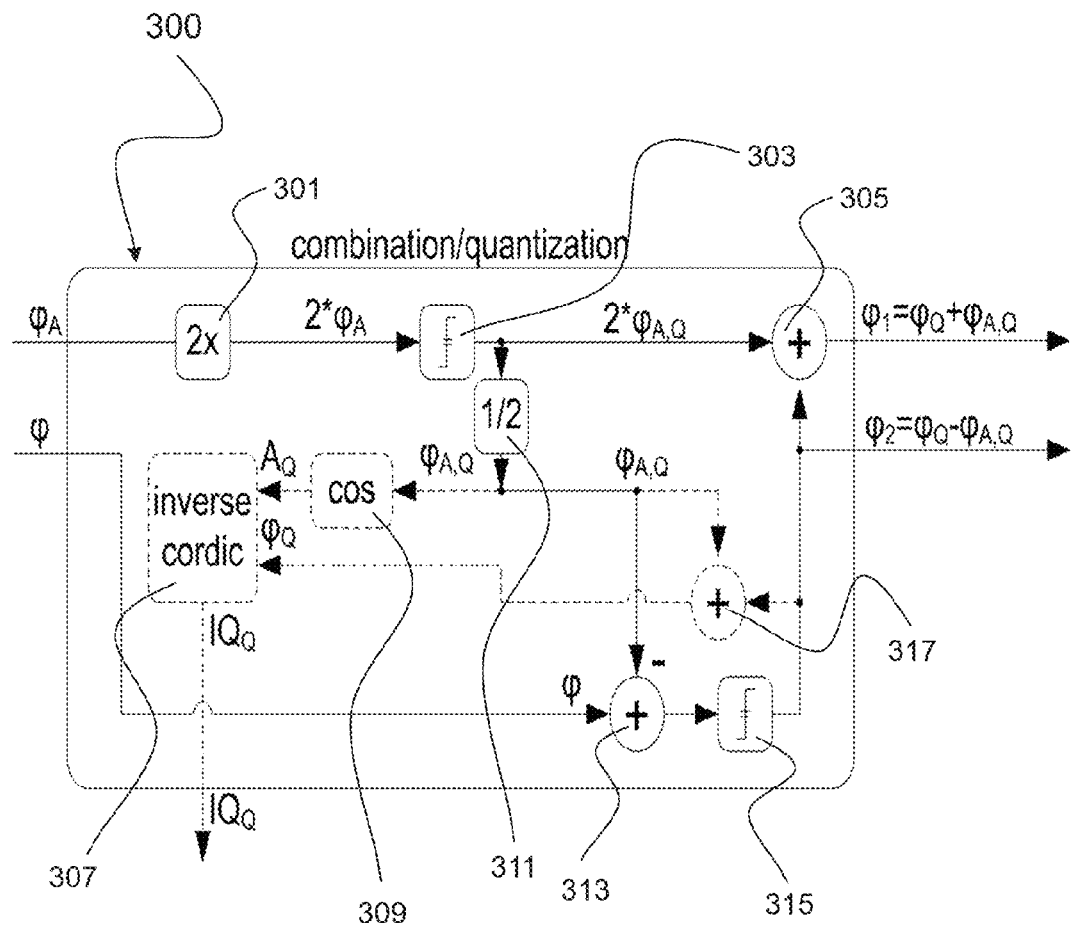
FIG. 3 is a block diagram illustrating a combining and quantization block in accordance with the disclosure.

FIG. 3 is a block diagram illustrating a combining and quantization block 300 in accordance with the disclosure. The combining and quantization block 300 may correspond to the quantized combination block 205 as described above with respect to FIG. 2.

The correct rounding may be ensured by first quantizing 303 the amplitude outphasing signal $\phi_A$ multiplied 301 by two, and then quantizing 315 the second control signal $\phi_2$. The first control signal $\phi_1$ may be calculated by adding 305 the doubled 301 quantized amplitude signal $2\phi_A$ to the second control signal $\phi_2$.

The second control signal $\phi_2$ may be calculated by subtracting 313 the quantized 303 amplitude signal $\phi_{A,Q}$, i.e. the halved 311 doubled 301 quantized 303 amplitude signal $\phi_A$, from the phase signal $\phi$ and quantizing 315 the result. An optional inverse cordic 307 may be used to provide the quantized IQ signal $IQ_Q$ based on the quantized amplitude signal $\phi_{A,Q}$ and a combination, e.g. addition 317, of the quantized amplitude signal $\phi_{A,Q}$ and the second control signal $\phi_2$.

An optional inverse cordic 307 may be used for providing the complex IQ baseband sample value $IQ_Q$ for delta sigma feedback, e.g. corresponding to the delta sigma modulator 805 as described below with respect to FIG. 8.

Figure 4:
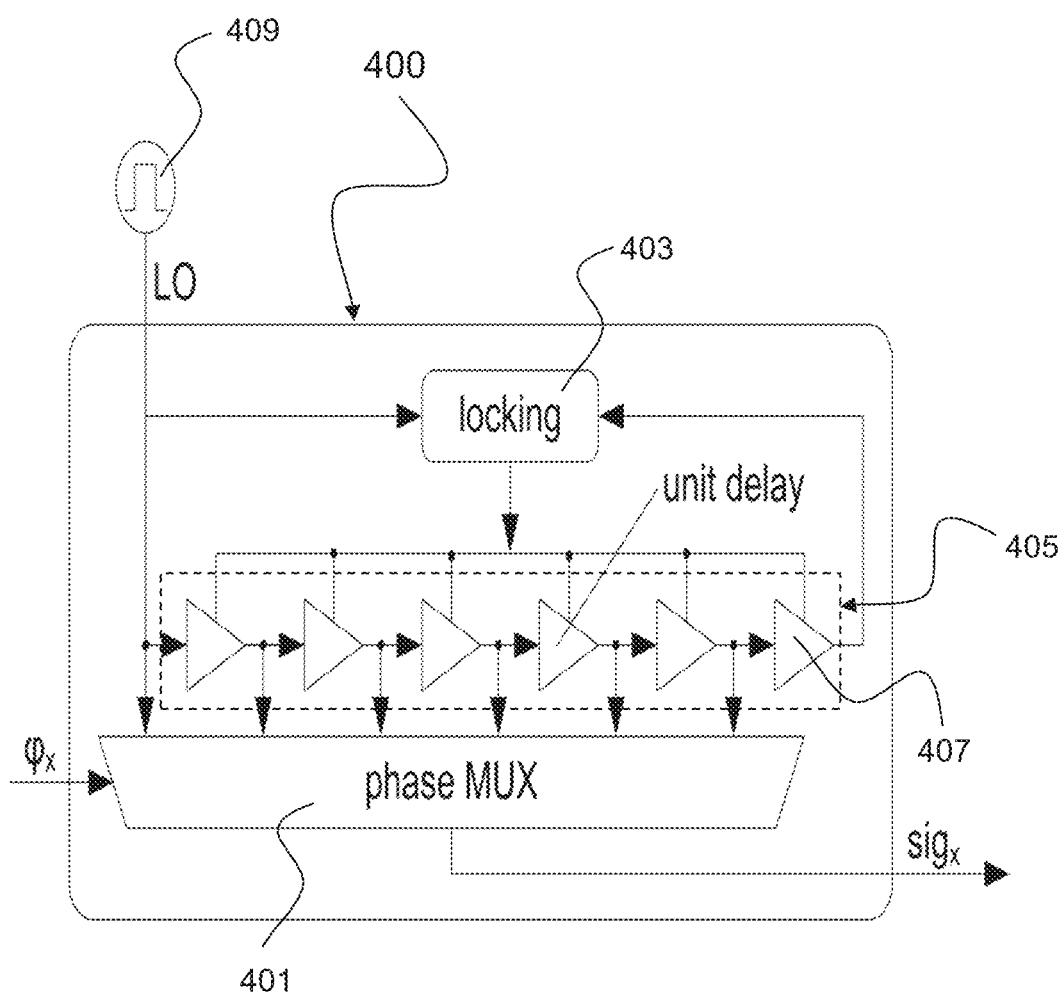
FIG. 4 is a block diagram illustrating a circular phase modulator in accordance with the disclosure.

FIG. 4 is a block diagram illustrating a circular phase modulator 400 in accordance with the disclosure. The circular phase modulator 400 may correspond to one or both of the phase modulators 207, 209 as described above with respect to FIG. 2.

The discrete phase modulator 400 may consist of a line 405 of unit delays 407. The modulator output $sig_x$ may be selected by means of a multiplexer 401 that may be controlled by the input signal $\phi_x$. The LO signal 409 may be assumed to be a 50% square wave signal. The delay line 405 may be locked by a locking unit 403 to the LO signal 409 to ensure that the last tap of the delay line 405 corresponds to 360°.

Figure 5:
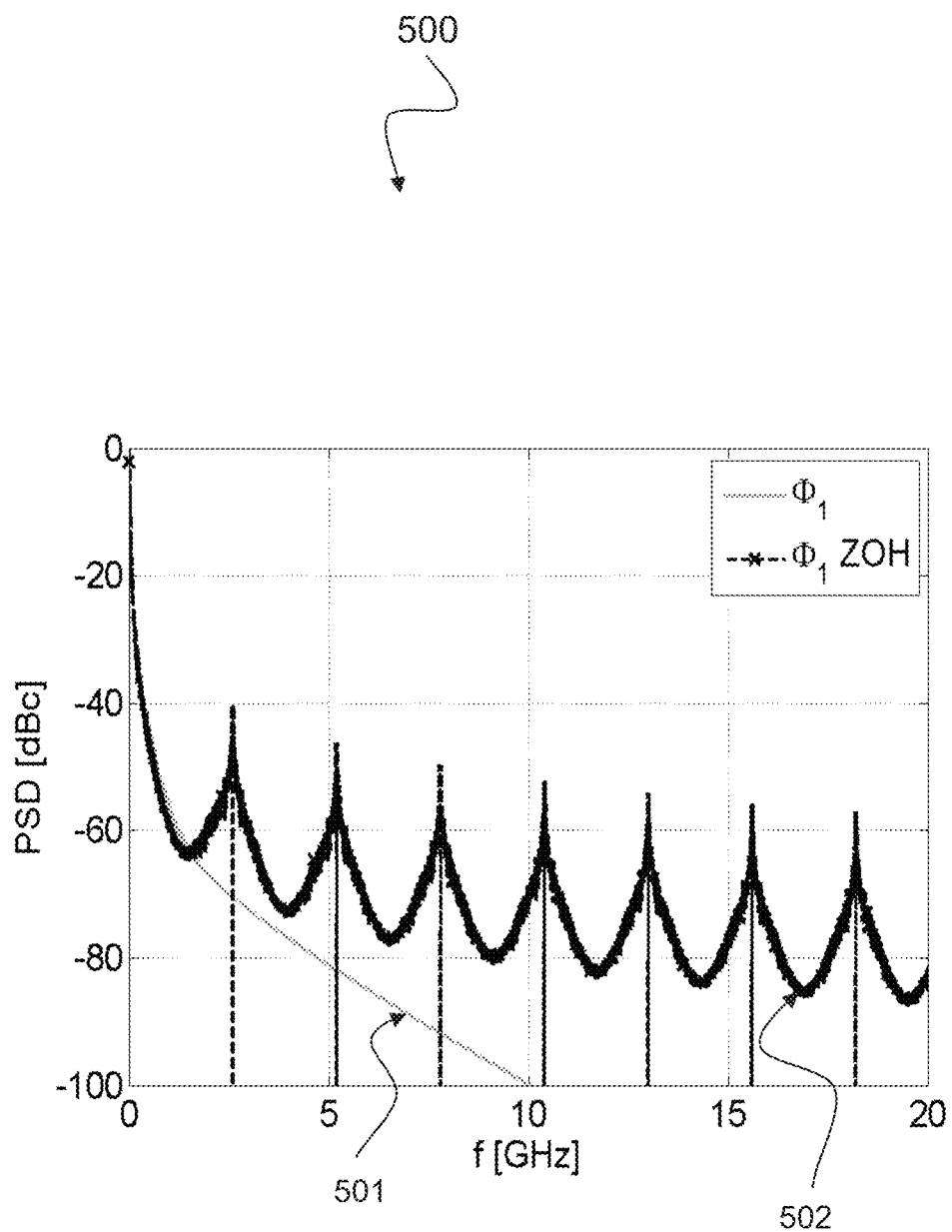
FIG. 5 is a spectral diagram illustrating a spectrum of an outphasing signal with and without ZOH (Zero-Order Hold).

FIG. 5 is a spectral diagram illustrating a spectrum 500 of an outphasing signal with and without ZOH (Zero-Order Hold).

The implementation of the RF-PWM modulator core 200 as described above with respect to FIG. 2 may enable an update of the phase signal once per carrier period and may thus implicitly perform a ZOH. Therefore, the two outphasing signals $\phi_1$ and $\phi_2$ may be sampled at carrier frequency. The effect of this sampling can be seen in FIG. 5. The power spectral density (PSD) of the ideal continuous time signal

501, $\phi_1$ may continuously decrease for higher frequencies such as 2.5 to 10 GHz, whereas the ZOH sampled signal 502 may show peaks at the carrier frequency (2.6 GHz) and its multiples. An exemplary carrier frequency of 2.6 GHz and an exemplary bandwidth of 40 MHz may be used to illustrate the following figures, unless otherwise noted.

Figure 6:
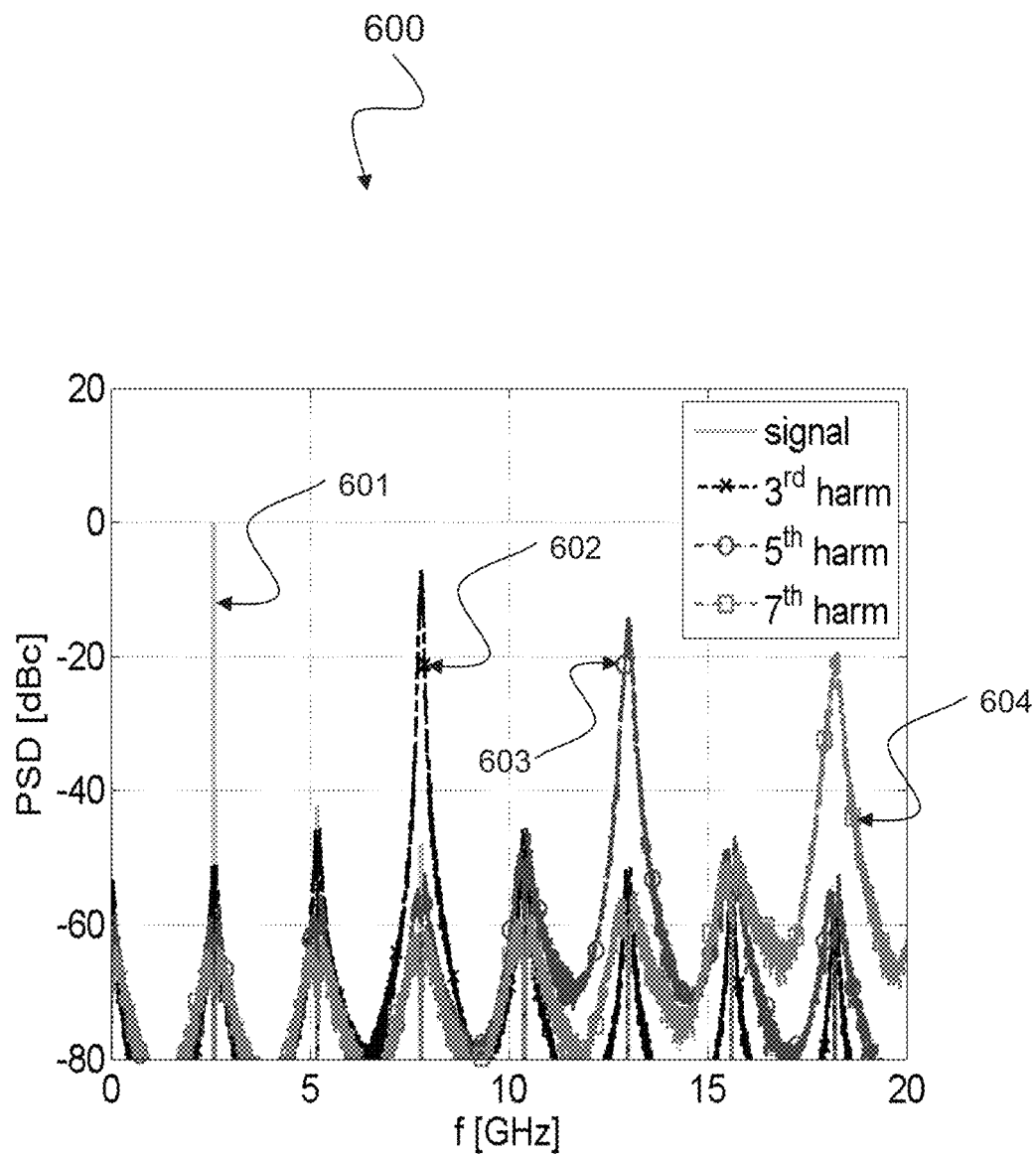
FIG. 6 is a spectral diagram illustrating a spectrum of a phase modulator output and a combined signal showing the limitation due to aliasing effects.
Figure 7:
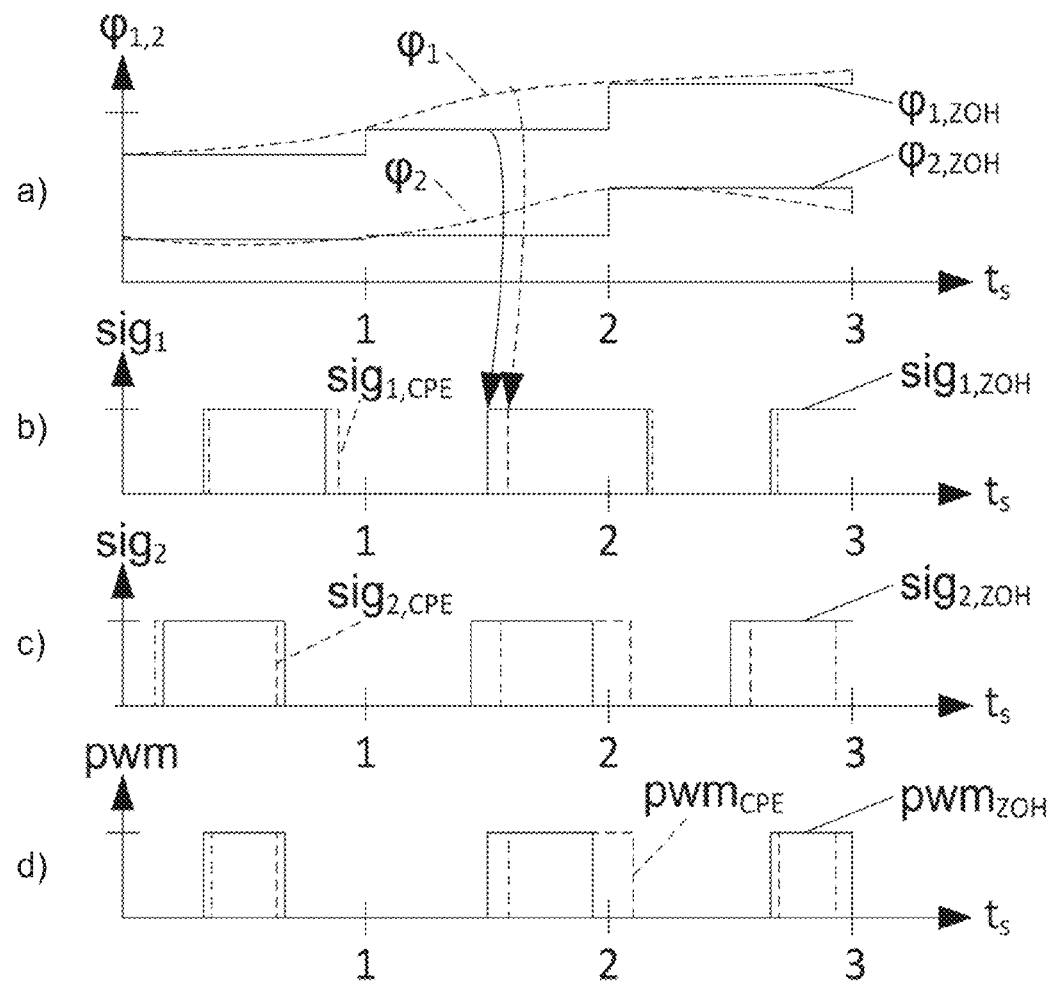
FIGS. 7a to 7d are time domain diagrams illustrating modulator signals to show the effects of sampling.

FIG. 6 is a spectral diagram illustrating a spectrum 600 of the phase modulator 207, 209 output and a combined signal showing the limitation due to aliasing effects.

This effect severely limits the signal quality of the output signals of the two phase modulators 207, 209 when no CPE is applied. The input signal 211 of the phase modulator 207, 209 may be a 50% square wave signal with harmonic content in all odd harmonics. This odd harmonics may be modulated by the input signal as well with a multiple excursion of the baseband (BB) signal, e.g. the $3^{rd}$ harmonic may be modulated by $3^*\phi_1$ and so on. Due to this effect the ZOH peaks at the carrier frequency and multiples of it may be aliased back into the actual signal band causing distortion and limiting the signal quality, in particular when no CPE is applied. In FIG. 6, the input signal 601, the $3^{rd}$ harmonic 602, the $5^{th}$ harmonic 603 and the $7^{th}$ harmonic 604 are depicted to illustrate the limitation due to aliasing effects.

FIGS. 7a to 7d are time domain diagrams illustrating modulator signals to show the effects of sampling. The time axis ($t_S$) is represented in units of the sampling period.

The figures illustrate the impact of ZOH in the time domain. From FIG. 7a, it can be seen that the input signals $\phi_1$ and $\phi_2$ may vary significantly over one sample period, whereas their ZOH sampled counterparts $\phi_{1,ZOH}$ and $\phi_{2,ZOH}$ may remain constant over the sample period. Caused by the ZOH, a difference to the ideal signal at the signal crossings may occur, as can be seen when comparing $\text{sig}_{x,CPE}$ and $\text{sig}_{x,ZOH}$ for x=1, 2 in FIGS. 7b and 7c. This may furthermore change the resulting PWM signal $\text{pwm}_{ZOH}$, as illustrated in FIG. 7d which may deviate from the ideal one for which $\text{pwm}_{CPE}$ is a close approximation. This difference may result in the aliasing products around the carrier in the frequency domain.

From FIG. 7d it can also be seen that the signal transitions of the pulse width modulated (pwm) signal may still be limited to one or maximum two pulses per carrier period or sampling period. The case of two pulses as shown in period 3, i.e. from unit 2 of the sampling period to unit 3 of the sampling period on time axis $t_S$, however, may seldom occur.

Considering that property allows to generate a control signal approximating the ideal pwm signal. Such control signal may be generated by correct prediction of the signal transitions by means of cross point estimation (CPE), e.g. as performed by the cross point estimator 101 described above with respect to FIG. 1. The case of two pulses per carrier period can be handled by additional circuitry and/or signal processing as described in the following.

Figure 8:
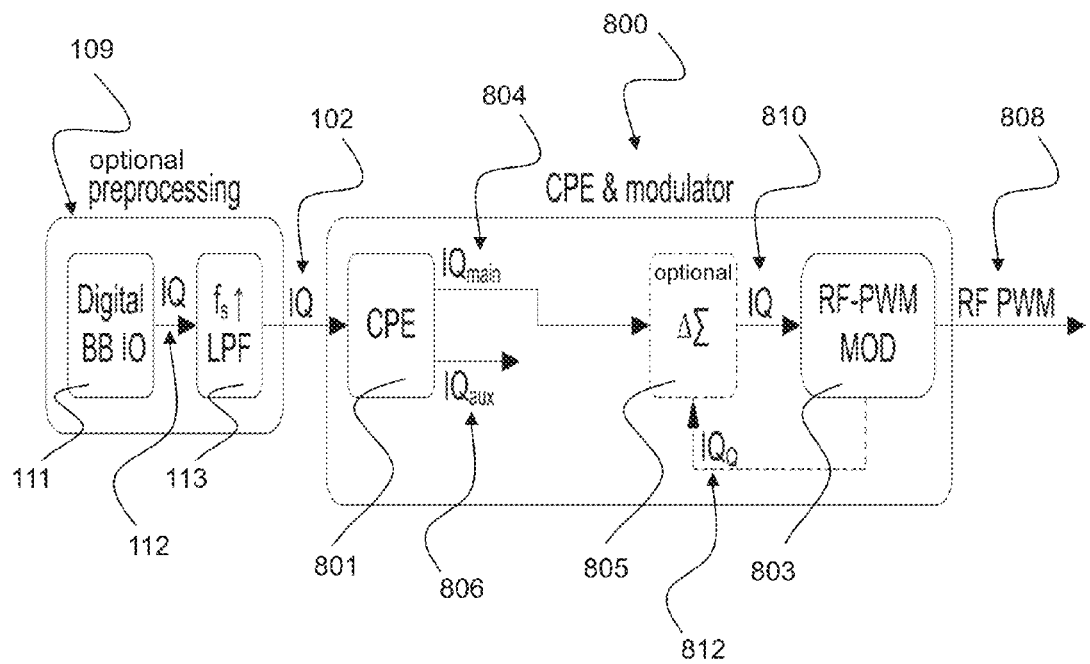
FIG. 8 is a block diagram illustrating a modulator circuit with CPE and optional noise shaping in accordance with the disclosure.

FIG. 8 is a block diagram illustrating a modulator circuit 800 with cross point estimation and optional noise shaping in accordance with the disclosure.

The modulator circuit 800 may include a cross point estimator 801, e.g. corresponding to the CPE 101 described above with respect to FIG. 1. The CPE 101 may be included in the modulator circuit 800 as illustrated in FIG. 8 or the CPE 101 may be pre-coupled to the modulator circuit 800 as illustrated in FIG. 1 in order to provide the modulator circuit 800 with the CPE corrected IQ input signal 804 and/or 806. The modulator circuit 800 may include a pulse-width modulator 803, in particular a radio frequency pulse-width modulator to provide an RF pulse-width modulated signal as modulated output signal 808.

The maximum update rate of the modulator circuit 800 may be limited by the carrier frequency. The modulator circuit 800 may perform an implicit zero order hold (ZOH) and may hold the value (for at least) one carrier period.

The modulator circuit 800 may provide a main IQ signal 804 and an auxiliary IQ signal 806 based on the IQ input signal 102 that may correspond to the IQ input signal 102 as described with respect to FIG. 1. The cross point estimator CPE 801 may deliver two output signals $IQ_{main}$ 804 and $IQ_{aux}$ 806, in which the $IQ_{main}$ signal may contain the cross point corrected first pulse signal information and $IQ_{aux}$ may contain information about possible second pulses. The main IQ signal 804 may approximate the main pulse per carrier period of the ideal pwm signal as described above with respect to FIG. 7 while the auxiliary IQ signal 806 may approximate the secondary pulse per carrier period of the ideal pwm signal as described above with respect to FIG. 7. The main IQ signal 804 may be used as IQ input signal 810 for the RF-PWM modulator 803 or as IQ input signal for the optional delta sigma modulator 805 as described in the following.

In one example, the modulator circuit 800 may include an optional delta sigma modulator 805 that may receive the CP corrected input signal 804 and a feedback signal 812 from the pulse-width modulator 803 to provide a noise-shaped IQ signal 810 to the pulse-width modulator 803. The delta sigma modulator 805 may be optional and may be used to shape the quantization noise.

In one example, the modulator circuit 800 may be coupled to an optional preprocessing unit 109 to receive the IQ input signal 102. The optional preprocessing unit 109 may include a digital baseband (BB) input output (IO) unit 111 and a sampling and low pass filtering (LPF) unit 113 for preprocessing baseband radio signals. The digital baseband input output unit 111 may provide a baseband IQ signal 112 that may be sampled and filtered by the sampling and low pass filtering (LPF) unit 113 and provided as the IQ input signal 102 to the cross point estimator 801 of the modulator circuit 800.

Figure 9:
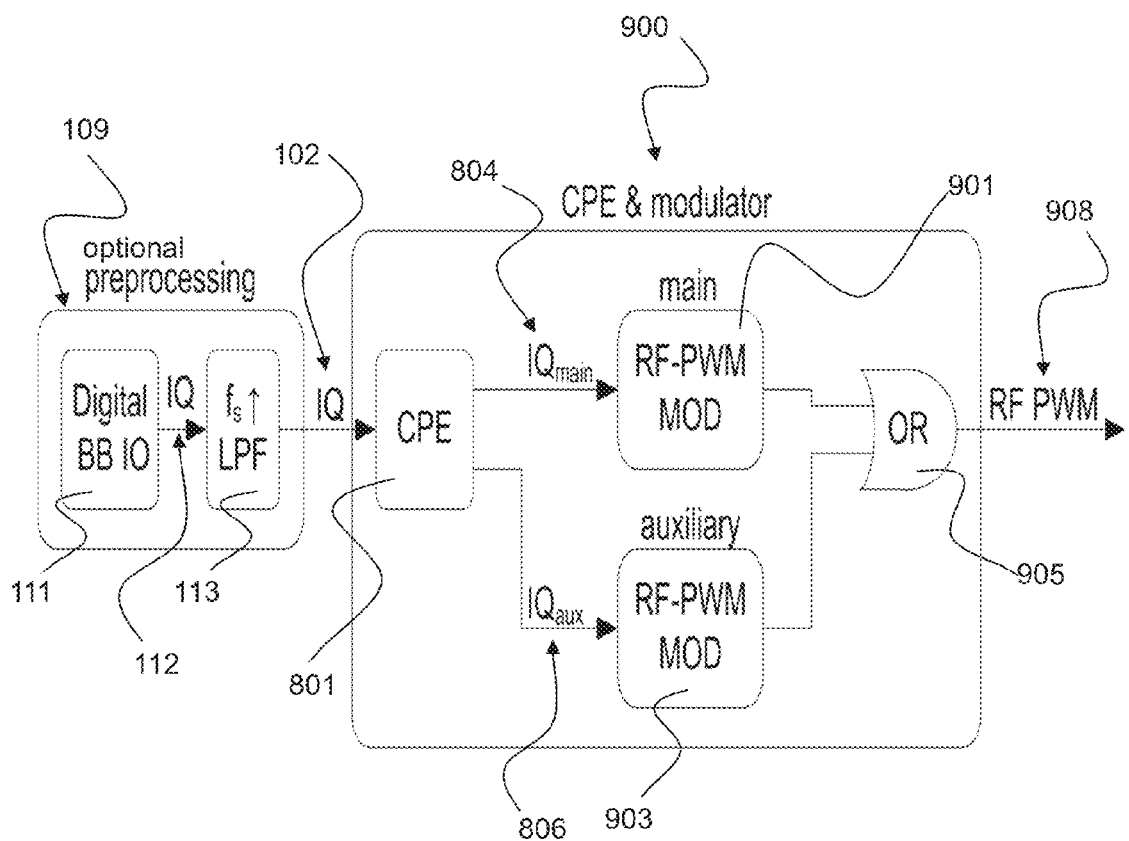
FIG. 9 is a block diagram illustrating a modulator circuit with CPE and auxiliary modulator branch in accordance with the disclosure.

FIG. 9 is a block diagram illustrating a modulator circuit 900 with cross point estimation and auxiliary modulator branch in accordance with the disclosure. The modulator circuit 900 may be configured to generate a first pulse and additionally a second pulse for one carrier period as described above with respect to FIG. 7. The signal for the first pulses $IQ_{main}$ 804 may be fed to a main RF-PWM modulator block 901 and the signal for the second pulses $IQ_{aux}$ 806 may be fed to an auxiliary RF-PWM modulator block 903. The output signals of both RF-PWM modulator blocks 901, 903 may be combined by means of a logical OR block 905. Both, the main RF-PWM modulator block 901 and the auxiliary RF-PWM modulator block 903 may correspond to the RF-PWM modulator block 803 as described above with respect to FIG. 8. Both, the main RF-PWM modulator block 901 and the auxiliary RF-PWM modulator block 903 may receive their IQ input signals from a respective delta sigma modulator (not depicted in FIG. 9) that may correspond to the delta sigma modulator 805 as described above with respect to FIG. 8.

The modulator circuit 900 may further include an optional preprocessing circuit 109 corresponding to the circuit 109 as described above with respect to FIGS. 1 and 8.

Figure 10:
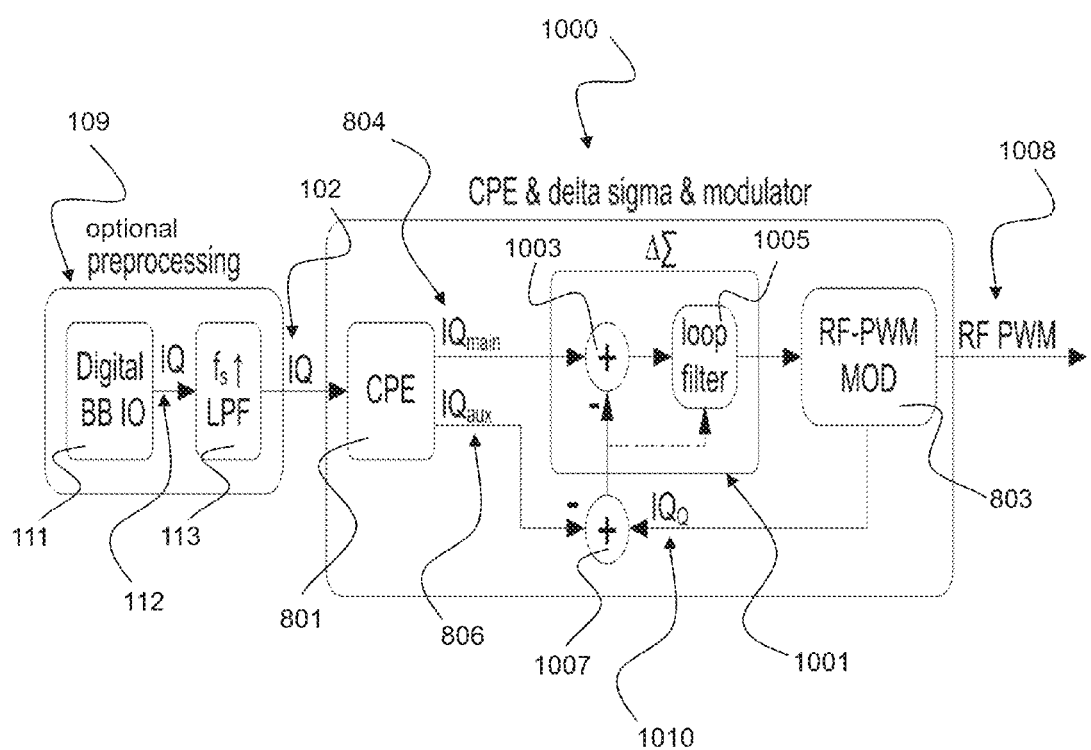
FIG. 10 is a block diagram illustrating a single branch modulator circuit with CPE and delta sigma noise shaping incorporating error feedback for the second pulse in accordance with the disclosure.

FIG. 10 is a block diagram illustrating a single branch modulator circuit 1000 with cross point estimation and delta sigma noise shaping incorporating error feedback for the second pulse in accordance with the disclosure. The single branch modulator circuit 1000 may include a cross point estimator 801 as described above with respect to FIG. 8 providing a main IQ signal 804 and an auxiliary IQ signal 806 and an RF-PWM modulator 803 as described above with respect to FIG. 8. The single branch modulator circuit 1000 may include a delta sigma modulator 1001 coupled between the CPE 801 and the RF-PWM modulator 803. A feedback of the delta sigma modulator 1001 may receive a combination, e.g. a subtraction 1007, of a quantized output signal $IQ_Q$ 1010 of the RF-PWM modulator 803 and the auxiliary IQ signal 806. The delta sigma modulator 1001 may perform noise shaping by using a loop filter 1005 receiving a difference signal 1003 between the main IQ signal 804 and the combined signal, i.e. the combination of the quantized output signal $IQ_Q$ 1010 and the auxiliary IQ signal 806.

The signal for the second pulse generator $IQ_{aux}$ 806 can also be considered as an "error" signal, if the second pulse is not generated. If a delta sigma noise shaping circuitry 1001 is used, this "error" signal 806 may be fed into the feedback of the delta sigma loop 1001.

The single branch modulator circuit 1000 may further include an optional preprocessing circuit 109 corresponding to the circuit 109 as described above with respect to FIG. 8.

Figure 11:
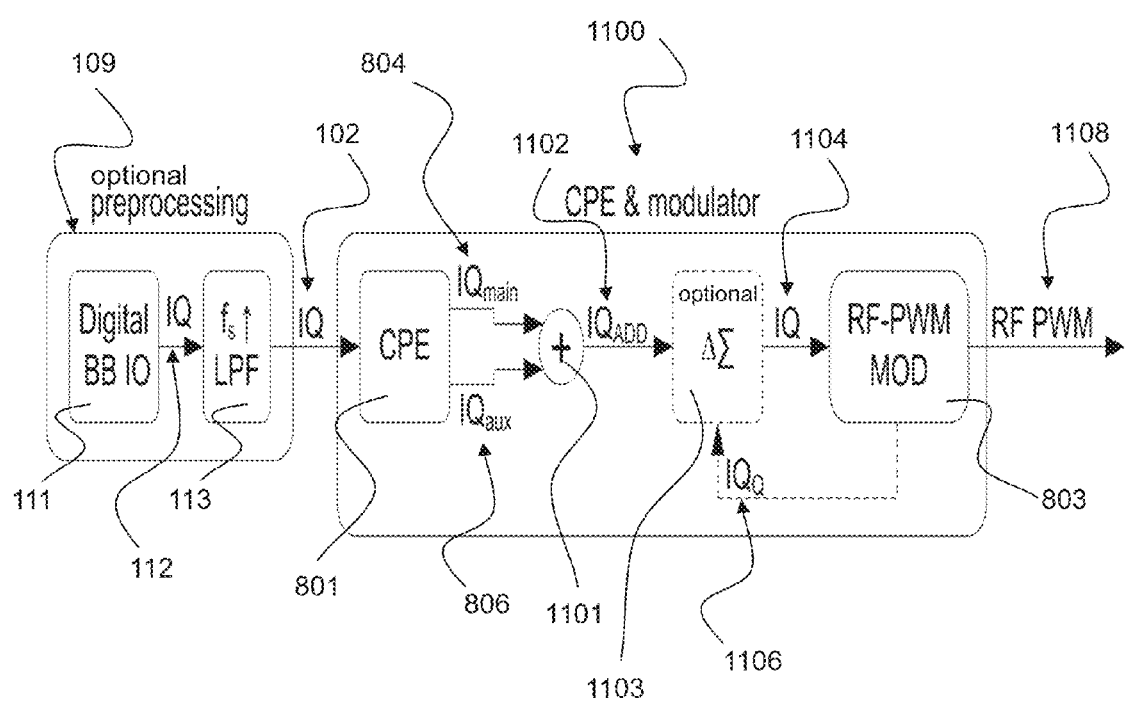
FIG. 11 is a block diagram illustrating a single branch modulator circuit with additive CPE and optional delta sigma noise shaping in accordance with the disclosure.

FIG. 11 is a block diagram illustrating a single branch modulator circuit 1100 with additive cross point estimation and optional delta sigma noise shaping 1103 in accordance with the disclosure.

The single branch modulator circuit 1100 with CPE may include a cross point estimator 801 as described above with respect to FIG. 8 providing a main IQ signal 804 and an auxiliary IQ signal 806 and an RF-PWM modulator 803 as described above with respect to FIG. 8. Compared to the single branch modulator circuit 1000 depicted in FIG. 10, the error feedback from the auxiliary IQ signal $IQ_{aux}$ 806 may be removed from the delta sigma loop 1001 resulting in an implementation as given in FIG. 11, making the noise shaping circuit 1103 optional.

The single branch modulator circuit 1100 with CPE may include a combiner 1101, e.g. an adder, for combining the main IQ signal 804 and the auxiliary IQ signal 806 to provide a combined, e.g. added, IQ signal $IQ_{ADD}$ 1102. The optional delta sigma modulator 1103 may be coupled between the combiner 1101 and the RF-PWM modulator 803. The combined IQ signal $IQ_{ADD}$ may be received by the optional delta sigma modulator 1103 or by the RF-PWM modulator 803 in the example without delta sigma modulator. A feedback of the delta sigma modulator 1103 may receive a quantized output signal $IQ_Q$ 1106 of the RF-PWM modulator 803.

The single branch modulator circuit with CPE 1100 may further include an optional preprocessing circuit 109 corresponding to the circuit 109 as described above with respect to FIG. 8.

Figure 12:
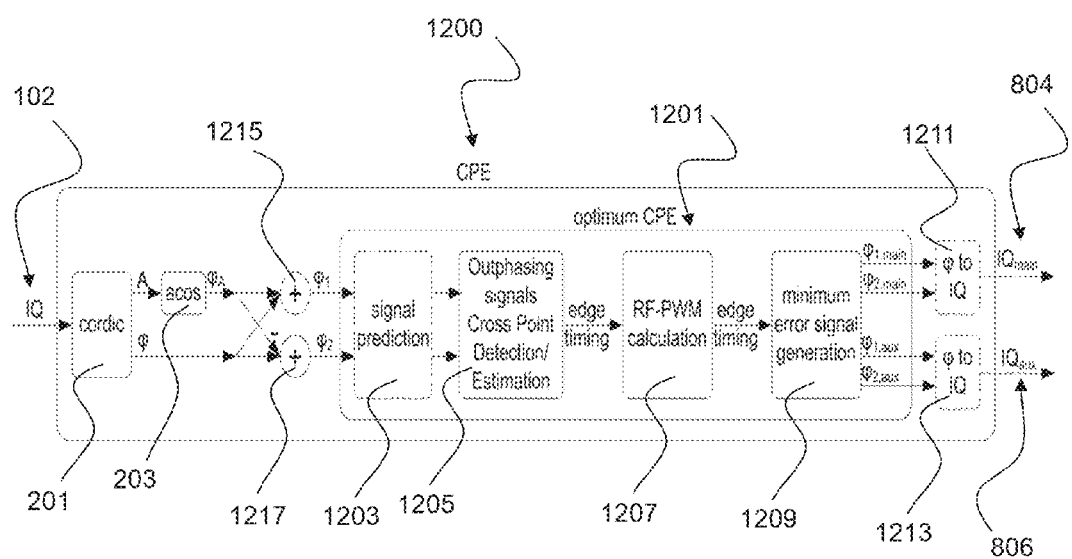
FIG. 12 is a block diagram illustrating a CPE circuit for optimum signal generation in accordance with the disclosure.

FIG. 12 is a block diagram illustrating a cross point estimation circuit 1200 for optimum signal generation in accordance with the disclosure. The cross point estimation circuit 1200 may include an optimum CPE processing unit 1201 including a first unit 1203 for signal prediction, a second unit 1205 for outphasing signals cross point detection and estimation, a third unit 1207 for RF-PWM calculation and a fourth unit 1209 for minimum error signal generation. The optimum CPE processing unit 1201 may generate two main control signals $\phi_{1,main}$, $\phi_{2,main}$ and two auxiliary control signals $\phi_{1,aux}$, $\phi_{2,aux}$ based on two control signals also denoted as outphasing signals $\phi_1$, $\phi_2$ received at inputs of the optimum CPE processing unit 1201. The cross point estimation CPE circuit 1200 may include a first φ-to-IQ converter 1211 and a second 1213 φ-to-IQ converter. The first φ-to-IQ converter 1211 may convert the two main control signals $\phi_{1,main}$, $\phi_{2,main}$ into the main IQ signal 804 that may correspond to the main IQ signal 804 described above with respect to FIG. 8. The second φ-to-IQ converter 1213 may convert the two auxiliary control signals $\phi_{1,aux}$, $\phi_{2,aux}$ into the auxiliary IQ signal 806 that may correspond to the main IQ signal 806 described above with respect to FIG. 8.

The IQ input signal 102 that may be input to the cross point estimation circuit 1200 may be decomposed into a phase φ and an amplitude A by means of a CORDIC processor 201 according to the device described above with respect to FIG. 2. The outphasing signal $\phi_A$ may be calculated by applying an inverse cosine 203 to the amplitude signal A. The control signals $\phi_1$ and $\phi_2$ for the optimum CPE processing circuit 1201 may be a combination 1215, 1217, e.g. an addition/subtraction of the phase signal φ and the outphasing signal $\phi_A$. In one example as depicted in FIG. 12, the first control signal $\phi_1$ may be an addition of the phase signal φ and the outphasing signal $\phi_A$ and the second control signal $\phi_2$ may be a subtraction of the outphasing signal $\phi_A$ from the phase signal φ.

For the cross point estimation the ideal values of the outphasing signals $\phi_1$ and $\phi_2$ may be calculated with sufficient resolution. These signals may be sampled at carrier rate or above and may be fed into the optimum CPE block 1201, where the actual signal calculation may be performed. For the calculation of the crossing points a predicted version 1203, e.g. a next sample, of the signal may be used. This may be done by using sample prediction 1203 if zero delay is required. By inserting a carrier period delay, ideal prediction can be achieved. First, the crossing points of the outphasing signals $\phi_1$ and $\phi_2$ may be calculated and handed over as timing information (e.g. as signal edges) to the next block 1205. Afterwards, the calculated timing information of the crossing points (e.g. the signal edges) may be fed to the RF-PWM signal generation block 1207 which may calculate the timing information of the desired RF-PWM signal. The output of this block 1207 may be the timing information about the rising and falling edges of the desired RF-PWM signal. Based on this information the minimum error signal generation block 1209 may decide which signals may be generated. There may be two signal outputs provided, the outphasing signals $\phi_{1,main}$ and $\phi_{2,main}$ for the main branch and the outphasing signals for $\phi_{1,aux}$ and $\phi_{2,aux}$ the auxiliary branch.

The main branch may contain the control signals for the pulse with the minimum error and the auxiliary branch may contain the control signals for a possible second pulse. These control signals may be directly fed to the modulator, e.g. to the RF-PWM modulator 803 as described above with respect to FIGS. 8 to 11 or converted into IQ signals for further signal processing, such as noise shaping.

Figure 13:
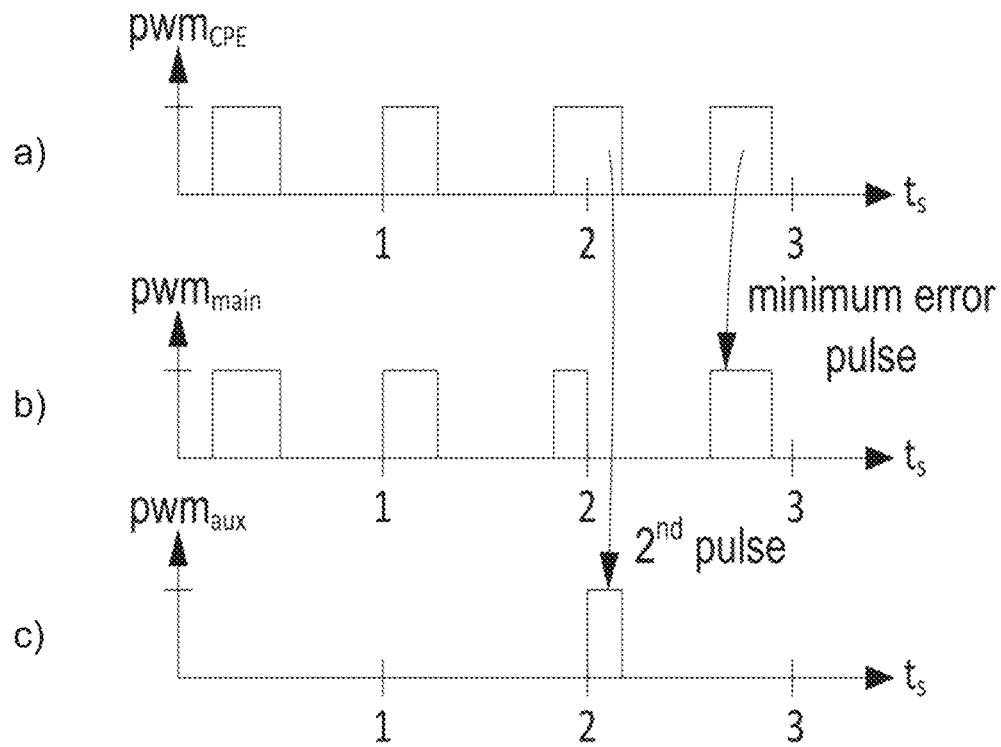
FIGS. 13a to 13c are schematic diagrams illustrating examples of main and auxiliary branch signal decision.

FIGS. 13a to 13c are schematic diagrams illustrating examples of main and auxiliary branch signal decision for minimum error signal generation. The time axis $t_S$ is scaled in units of the carrier period.

For the first period, i.e. from unit 0 of the carrier period to unit 1 of the carrier period, the ideal CPE signal approximated by the CPE PWM signal $pwm_{CPE}$ as depicted in FIG. 13a can be represented by the main branch only, i.e. by the signal $pwm_{main}$ depicted in FIG. 13b, and the output of the auxiliary branch, i.e. the signal $pwm_{aux}$ depicted in FIG. 13c, may be set to zero. This may also be true for the second period, i.e. from unit 1 of the carrier period to unit 2 of the carrier period, where the pulses at the beginning and the end of the period may be circular connected and may therefore be generated by a single modulator branch. For the third period, i.e. from unit 2 of the carrier period to unit 3 of the carrier period, in this example the signal $pwm_{CPE}$ may not be generated by a single branch anymore, as the pulses may be not connected. Therefore, the pulse with the smallest error with respect to the desired signal may be generated by the main branch and the second pulse may be fed to the auxiliary branch.

Figure 14:
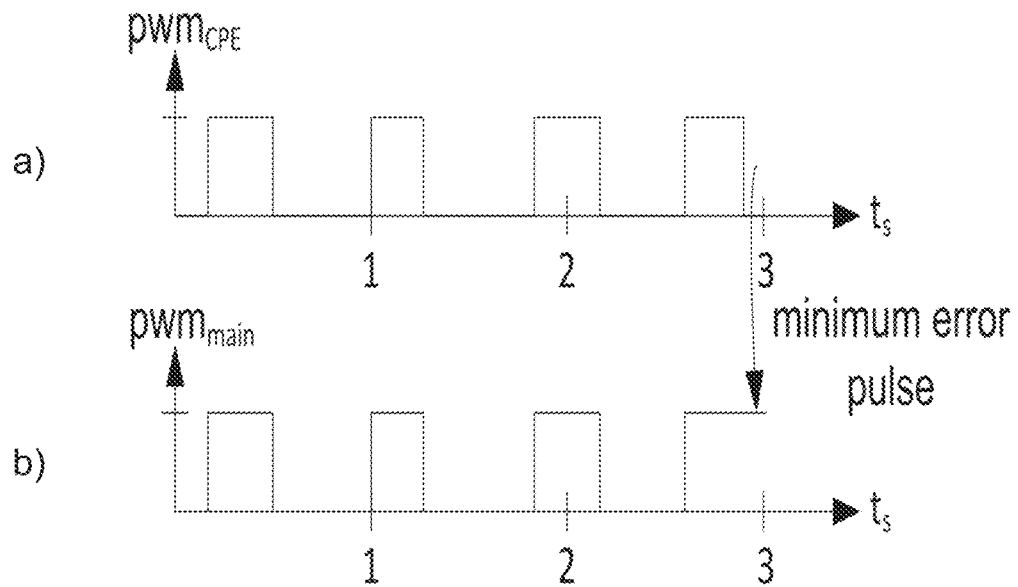
FIGS. 14a and 14b are schematic diagrams illustrating examples of main and auxiliary branch signal decision.

FIGS. 14a and 14b are schematic diagrams illustrating examples of main and auxiliary branch signal decision. If only one branch is used minimum error signal may be generated according to the illustration of FIG. 14b. The time axis $t_S$ is scaled in units of the carrier period.

For the first and second periods, i.e. from unit 0 of the carrier period to unit 2 of the carrier period, the ideal CPE signal approximated by the CPE PWM signal pwm$_{CPE}$ as depicted in FIG. 14a may be represented by the main branch, i.e. by the signal pwm$_{main}$ depicted in FIG. 13b. For the third period, i.e. from unit 2 of the carrier period to unit 3 of the carrier period, the pulse with the smallest error with respect to the desired signal may be generated by the main branch.

FIGS. 15a to 15d are schematic diagrams illustrating examples of analog (ANA), zero order hold (ZOH) and cross point estimation (CPE) PWM signal generation based on amplitude information only. The time axis $t_S$ is scaled in units of the carrier period or sample period.

A correct cross point estimation of the outphasing signals may be important for the signal quality. In FIGS. 15a and 15b an illustration of the sampling problem with ZOH is given. FIGS. 15c and 15d illustrate the comparison with the analog solution and the amplitude CPE.

As a reference function $V_{REF}$ depicted in FIGS. 15a and 15c for the generation of the PWM signal (pwm) depicted in FIGS. 15b and 15d, a saw tooth function with respect to an amplitude signal A is used. When the amplitude signal A is above the reference function the pwm signal may be zero, if it is above, the pwm signal may be one.

From the timing diagram of FIG. 15a can be seen that the analog input signal $A_{ANA}$ may change continuously during one sample period, whereas the ZOH sampled signal $A_{ZOH}$ may remain constant. This may lead to a different pwm signal pwm$_{ANA}$ for the analog case than pwm$_{ZOH}$ for the digital implementation (ZOH based) as can be seen from the timing diagram of FIG. 15b. This effect may cause signal distortion. A solution to this problem is linear cross point estimation as illustrated in the timing diagrams of FIGS. 15c and 15d. The signal transition of the pwm signal may be caused by interpolating between the current and the next sample. The resulting cross point estimated digital signal ($A_{CPE}$, pwm$_{CPE}$) may be much closer to the desired analog signal ($A_{ANA}$, pwm$_{ANA}$) than the simple ZOH signal ($A_{ZOH}$, pwm$_{ZOH}$) as depicted in FIGS. 15a and 15b. This effect of cross point estimation may reduce distortion and may improve signal quality.

FIGS. 16a to 16c are schematic diagrams illustrating examples of the outphasing signal calculation in accordance with the disclosure.

In case of RF-PWM signal generation the cross point estimation may be different, as the cross points of phase modulated signal may have to be predicted. The calculation of the outphasing signals used for the RF-PWM signal generation may be written as (1) for the indices x=1 and x=2.

$$\text{sig}_x = \text{sign}(\sin(\omega t + \phi_x(t))) = \text{sign}(\sin((\phi_{Cx})), \quad (1)$$

where the function sign(.) may be defined as $$\text{sign}(a) = \begin{cases} 1, & \text{if } a > 0 \\ 0, & \text{else} \end{cases}. \quad (2)$$

If the input signal $\phi_x(t)$ as depicted in FIG. 16a may be sufficiently high oversampled with respect to carrier frequency, i.e. if it may have many samples per carrier period, the desired signal $\phi_{x,CPE}(t)$ may be calculated by using equation (1) and by detecting the crossing points, i.e. the signal transitions, of the oversampled signal sig$_x$ as depicted in FIG. 16c. In case of a carrier rate input signal a linear estimation may be used. The calculation steps for the linear prediction according to equation (1) are depicted in FIGS. 16a to 16c. Based on the current and the predicted sample the crossing points may be calculated.

To do so, the argument of the sine function ($\phi_{Cx} = \omega t + \phi_x$) as depicted in FIG. 16b may be calculated for the current and the next sample and based on linear interpolation the cross point estimated signal CPE may be calculated. For the signal transitions of the outphasing signal sig$_x$, the crossing points of the argument function ($\phi_{Cx} = \omega t + \phi_x$) with $\pi$ and multiples of it may be of importance. In between the signal transitions the argument signal may be not of importance. Therefore it may be sufficient to calculate the signal transitions based on linear interpolation between the current and the predicted sample. Alternatively, other kinds of prediction may be used.

In addition to the cross point estimated signal CPE the signal for the ZOH is plotted in FIG. 16b to depict the difference between the ZOH based estimation and the CPE based estimation. For the ZOH case, the outphasing signal sig$_x$ may always have a 50% duty cycle, but for the phase modulated case the signal may deviate from the constant 50% duty cycle and this may cause the distortions in the sampled ZOH case.

The following equations may provide an exemplary calculation of the crossing points. The input variables may be (3)

$$\phi_{Cx,N} = \phi_{x,N} \quad (3)$$

$$\phi_{Cx,N+1} = 2\pi + \phi_{x,N+1} \quad (4)$$

Based on this information the crossing points, according to the edge timing of the signals may be calculated, e.g. by using $$t_{edge} = \frac{\varphi_{ref} - \varphi_{Cx,N}}{\varphi_{Cx,N+1} - \varphi_{Cx,N}}. \quad (5)$$

For the calculation of the rising edges, the reference vector $\phi_{ref} = \{0, 2\pi, 4\pi\}$ may be used. Only the resulting edge timings that are within the current period [0-1] may be of importance and the others may be ignored. For determining the falling edges, the reference vector $\phi_{ref} = \{\pi, 3\pi\}$ may be used. Taking into account that $\phi_1$ may determine the falling edges and $\phi_2$ may determine the rising edges, the computational effort may be reduced and the demand for the calculation of the RF PWM signal may be mitigated, as the edge timing calculated by the CPE may directly define the signal.

Figure 17:
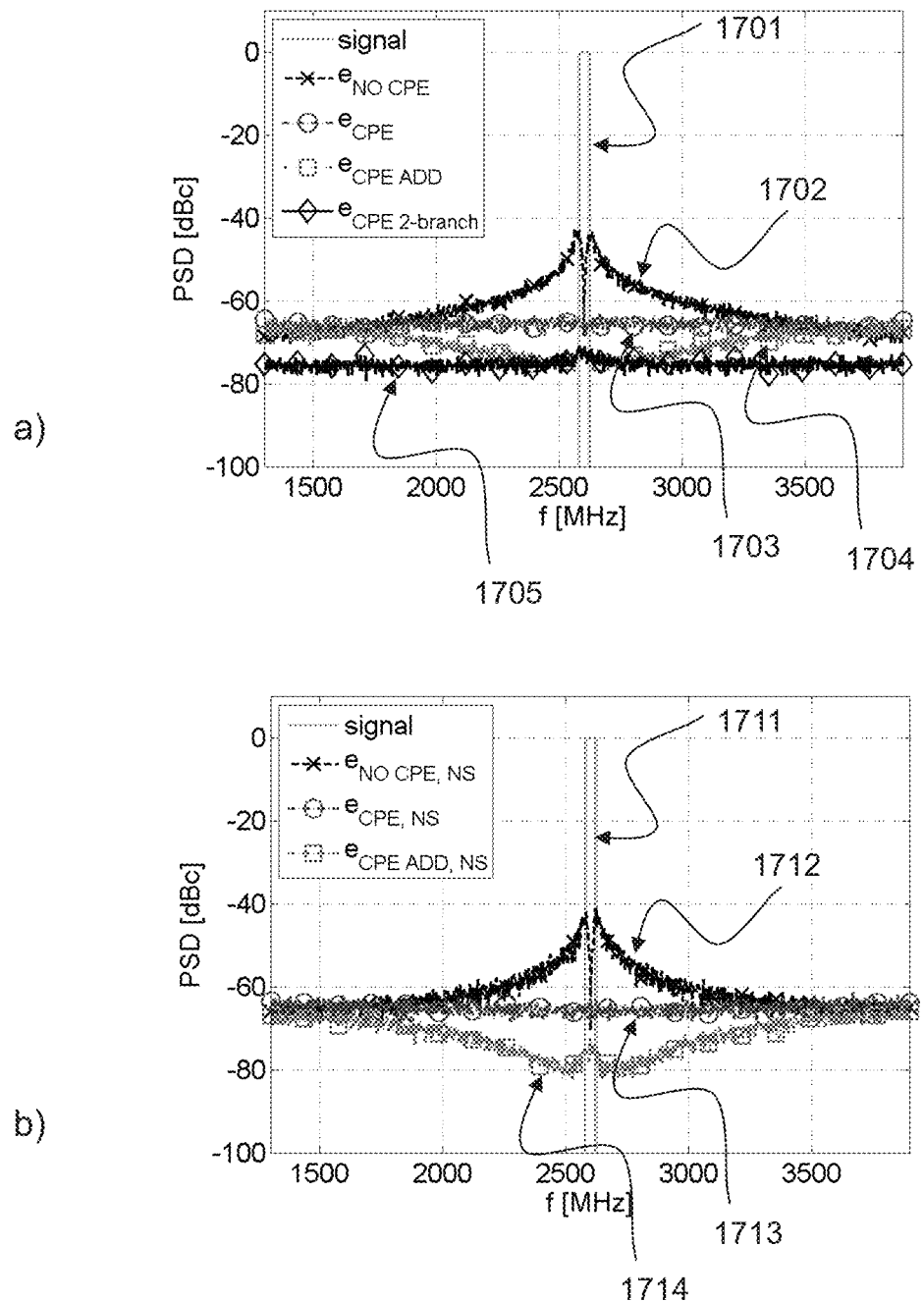
FIGS. 17a and 17b are spectral diagrams illustrating spectra for a 40 MHz multitone signal at 2.6 GHz carrier frequency and error signal for different CPE methods without noise shaping (FIG. 17a) and with noise shaping (FIG. 17b).

FIGS. 17a and 17b are spectral diagrams illustrating spectra for a 40 MHz multitone signal at 2.6 GHz carrier frequency and 11 bit timing resolution and error signal for different CPE methods without noise shaping (FIG. 17a) and with noise shaping (FIG. 17b).

In FIG. 17a the spectra of the ideal signal 1701 (signal) and the error signals 1702, 1703, 1704, 1705 (ideal signal subtracted by generated signal) for different CPE options are depicted. It can be seen from the error signal $e_{NO\ CPE}$ 1702 (ideal signal subtracted by generated signal) that the dynamic range may be limited to less than 45 dB if no cross point estimation is performed. By doing a single branch cross point estimation 1703 it may already be possible to improve the signal quality $e_{CPE}$, only limited by the missing second pulses. If the error signal of the second pulses is considered in the control signals according to the configuration described above with respect to FIG. 11, the inband signal quality $e_{CPE\_ADD}$ 1704 may be further improved. When using a second auxiliary modulator branch to generate the second pulses the best signal quality $e_{CPE\ 2\text{-}branch}$ 1705 may be achieved.

In FIG. 17b the same spectra 1711, 1712, 1713, 1714 corresponding to 1701, 1702, 1703, 1704, except for the two branch option 1705 are shown using a first order delta sigma noise shaper to show that the signal may remain unaffected by noise shaping.

Figure 18:
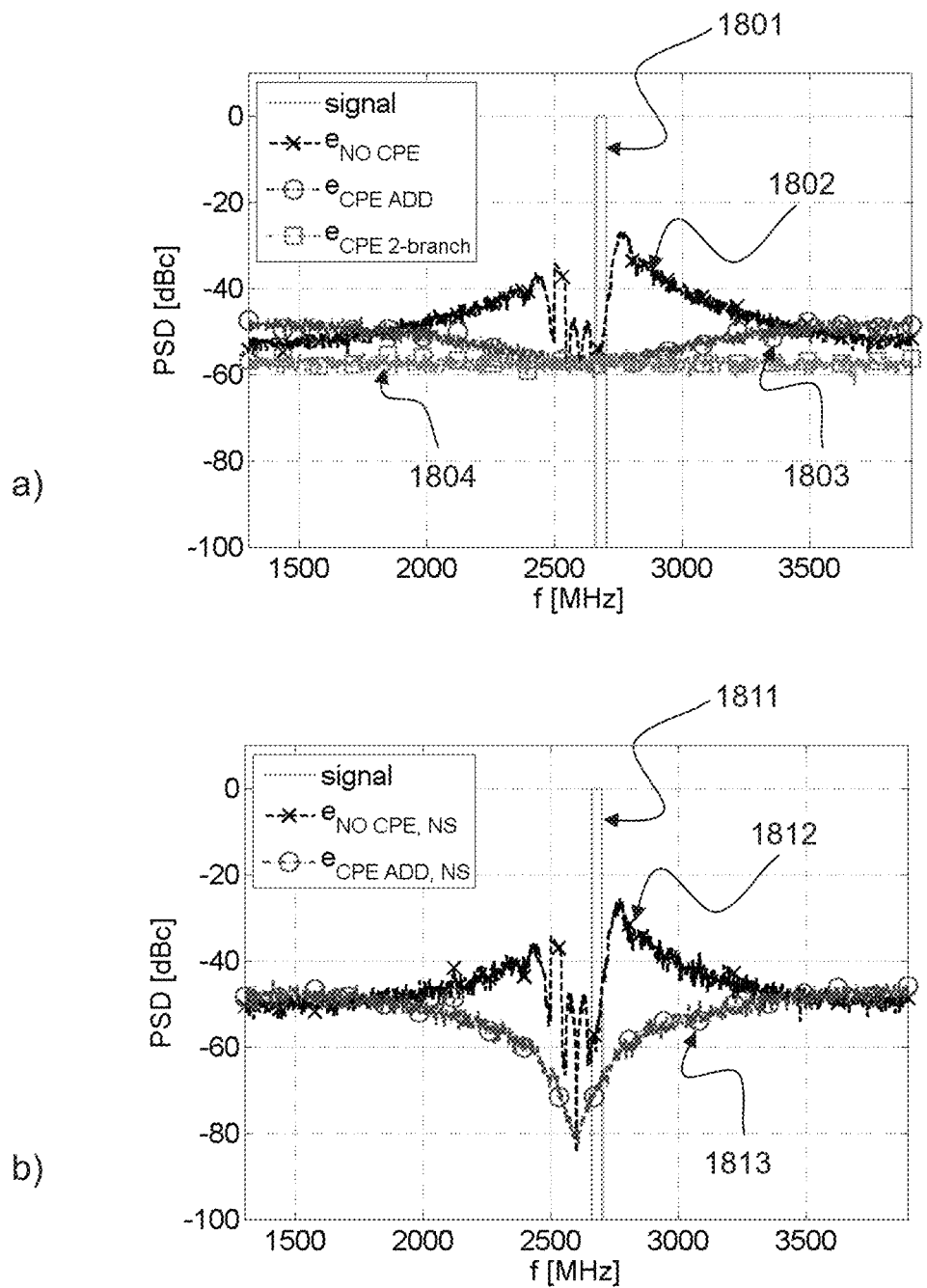
FIGS. 18a and 18b are spectral diagrams illustrating spectra for a 40 MHz multitone signal at 80 MHz offset from the 2.6 GHz carrier frequency and error signal for different CPE methods without noise shaping (FIG. 18a) and with noise shaping (FIG. 18b).

FIGS. 18a and 18b are spectral diagrams illustrating spectra for a 40 MHz multitone signal at 80 MHz offset from the 2.6 GHz carrier frequency and error signal for different CPE methods without noise shaping (NS) (FIG. 18a) and with noise shaping (FIG. 18b).

Carrier Aggregation (a frequency offset from the carrier frequency) may severely reduce the signal quality without CPE 1802. In FIG. 18a the spectra of a multitone signal with 40 MHz bandwidth and 80 MHz offset for a carrier frequency of 2.6 GHz and a time resolution of 8 bit are plotted. The limited signal quality of the modulator without CPE 1802 can be well seen in FIG. 18a by looking at trace $e_{NO\_CPE}$ 1802 which illustrates suffering from very high aliasing distortion. These aliasing effects may be reduced by the optimum cross point estimation, as can be seen in FIG. 18a by looking at the traces $e_{CPE\_ADD}$ 1803 and $e_{CPE\ 2\text{-}branch}$ 1804.

In FIG. 18b the spectra for a first order delta sigma noise shaping are plotted. A trace 1811 depicts the original signal, a trace 1812 depicts the case where no CPE but noise shaping is applied and a trace 1813 depicts the case where CPE and noise shaping is applied. It can be seen that the signal quality around the carrier may be high, as the quantization noise may be shaped away. Further, the signal quality may not be limited by aliasing effects when optimum CPE is performed $e_{CPE\_ADD,\ NS}$ 1813. The delta sigma noise shaper can additionally be used for shaping quantization noise due to pulse swallowing and/or calibration feedback. The term "pulse swallowing" may refer to the fact that short pulses cannot be generated by the modulator due to band-limitations. This may result in a large quantization step for low amplitudes. The resulting quantization noise can be shaped by means of a delta sigma noise shaping circuitry.

Figure 19:
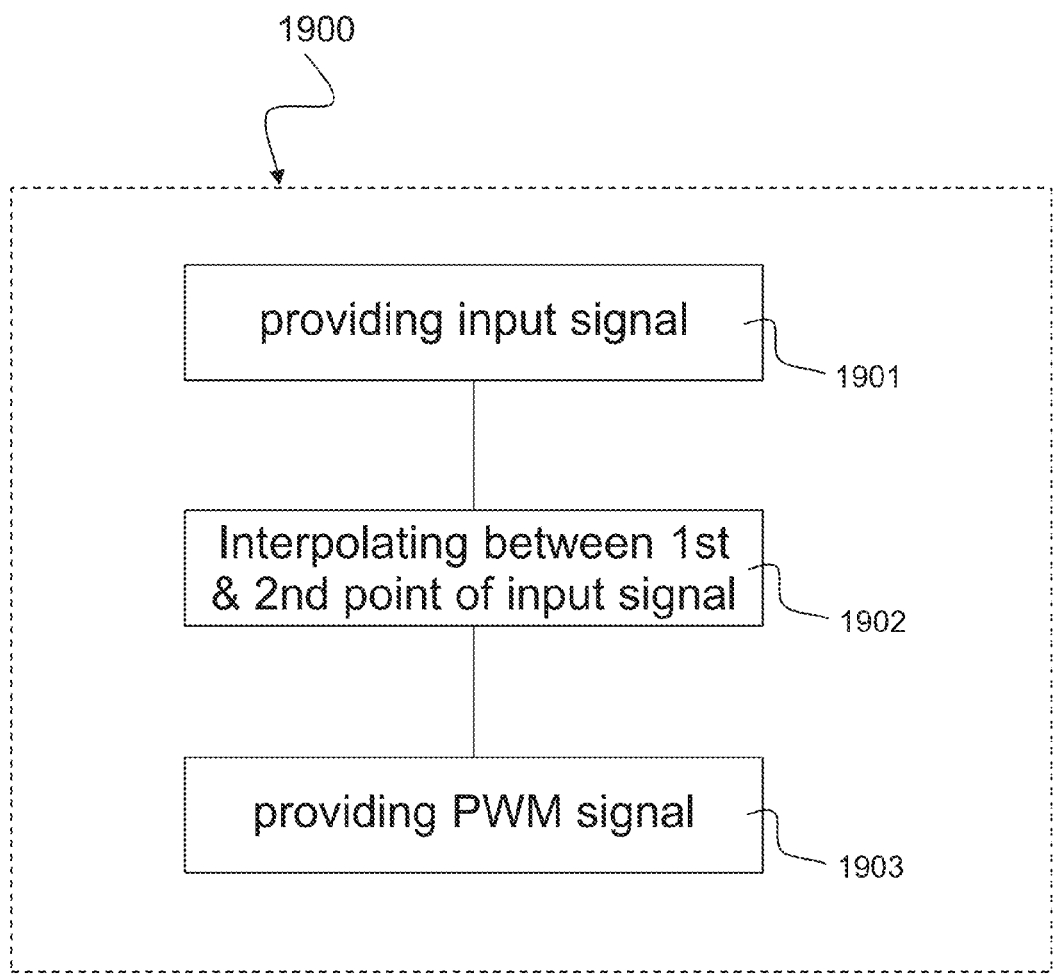
FIG. 19 is a schematic diagram illustrating a method for providing cross point information in accordance with the disclosure.

FIG. 19 is a schematic diagram illustrating a method 1900 for providing cross point information in accordance with the disclosure.

The method 1900 may include an act 1901 of providing an input signal having amplitude and phase information. The method 1900 may include an act 1902 of interpolating between a first point of the input signal and a second point of the input signal to provide cross point information between the first point and the second point. The method 1900 may include an act 1903 of providing a pulse-width modulated signal based on the input signal and the cross point information.

In one example, the method 1900 may include using the cross point information for compensating an error of the pulse-width modulated signal due to a sampling of the input signal. In one example, the first point may include a first sample of the input signal and the second point may include a second sample of the input signal. In one example, the method 1900 may include providing the second point of the input signal as a predicted version of the input signal based on the first point of the input signal. In one example, the first point and the second point of the input signal may include contiguous samples of the input signal. In one example, the input signal may be sampled at a carrier frequency of an oscillator signal. In one example, the method 1900 may include providing the second point of the input signal based on inserting a time delay of at least one carrier period of the oscillator signal to the input signal. In one example, the method 1900 may include providing the cross point information based on a linear interpolation between the first point of the input signal and the second point of the input signal.

Figure 20:
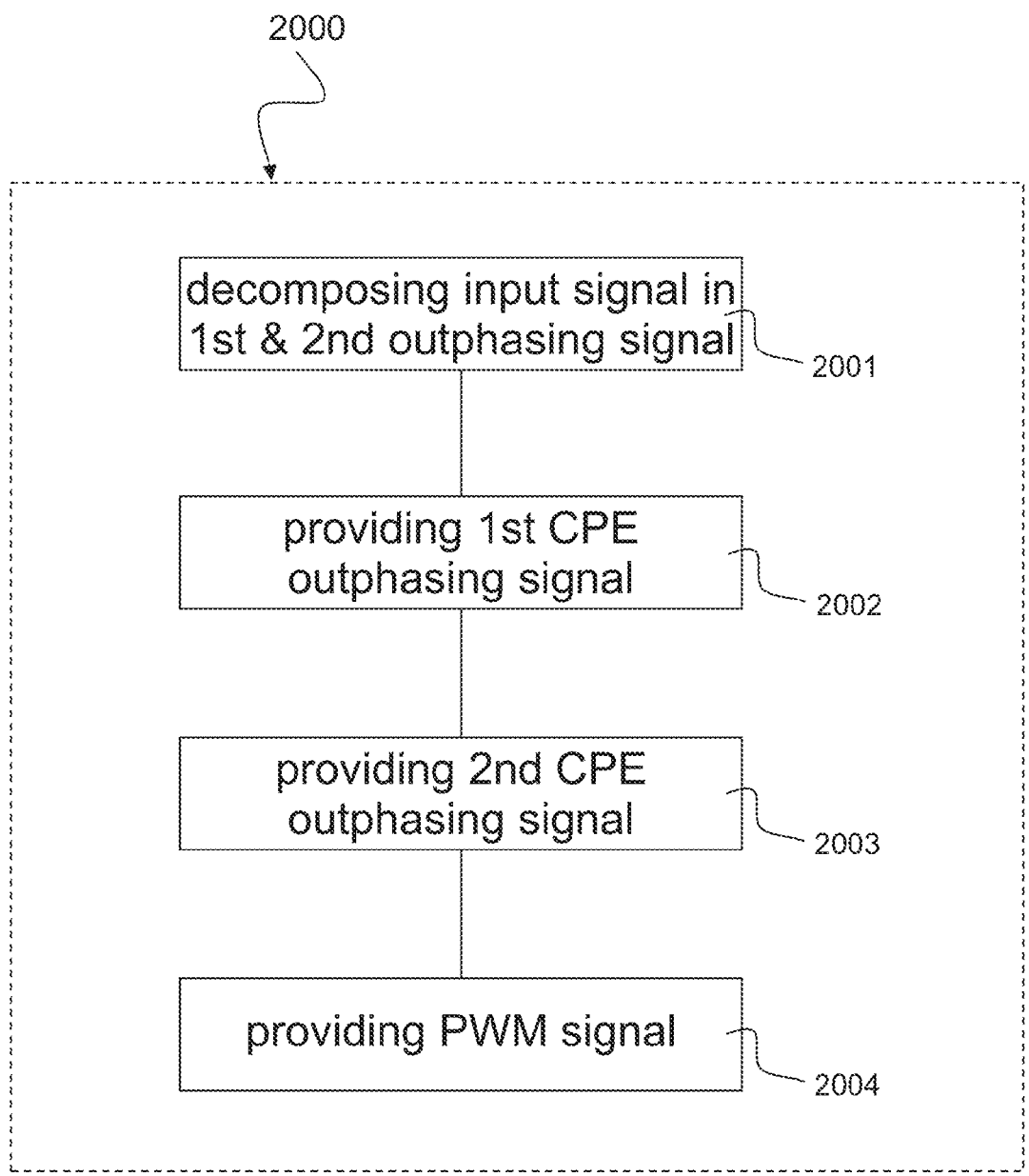
FIG. 20 is a schematic diagram illustrating a method for providing a pulse-width modulated signal in accordance with the disclosure.

FIG. 20 is a schematic diagram illustrating a method 2000 for providing a pulse-width modulated signal in accordance with the disclosure.

The method 2000 may include an act 2001 of decomposing an input signal having amplitude and phase information into a sum of a first outphasing signal and a second outphasing signal, wherein each of the first outphasing signal and the second outphasing signal has a constant amplitude and a time-varying phase. The method 2000 may include interpolating between a current sample and a subsequent sample of the first outphasing signal to provide a first cross point estimated outphasing signal (see act 2002). The method 2000 may include interpolating between a current sample and a subsequent sample of the second outphasing signal to provide a second cross point estimated outphasing signal (see act 2003). The method 2000 may include an act 2004 of providing the pulse-width modulated signal based on at least one of the first cross point estimated outphasing signal and the second cross point estimated outphasing signal.

In one example, the method 2000 may include providing at least one of the subsequent sample of the first outphasing signal and the subsequent sample of the second outphasing signal based on inserting a time delay of at least one carrier period. In one example, the act 2004 of providing the pulse-width modulated signal may include modulating a first square-wave signal with the first cross point estimated outphasing signal to provide a first pulse-width modulated signal and modulating a second square-wave signal with the second cross point estimated outphasing signal to provide a second pulse-width modulated signal.

In one example, the act 2004 of providing the pulse-width modulated signal may include combining the first pulse-width modulated signal and the second pulse-width modulated signal. In one example, interpolating between the current sample and the subsequent sample of the outphasing signals may be based on linear interpolation. In one example, the acts 2002, 2003 of interpolating between the current sample and the subsequent sample of the outphasing signals may be based on oversampling. In one example, the method 2000 may include noise-shaping the input signal based on at least one of the first cross point estimated outphasing signal and the second cross point estimated outphasing signal.

Figure 21:
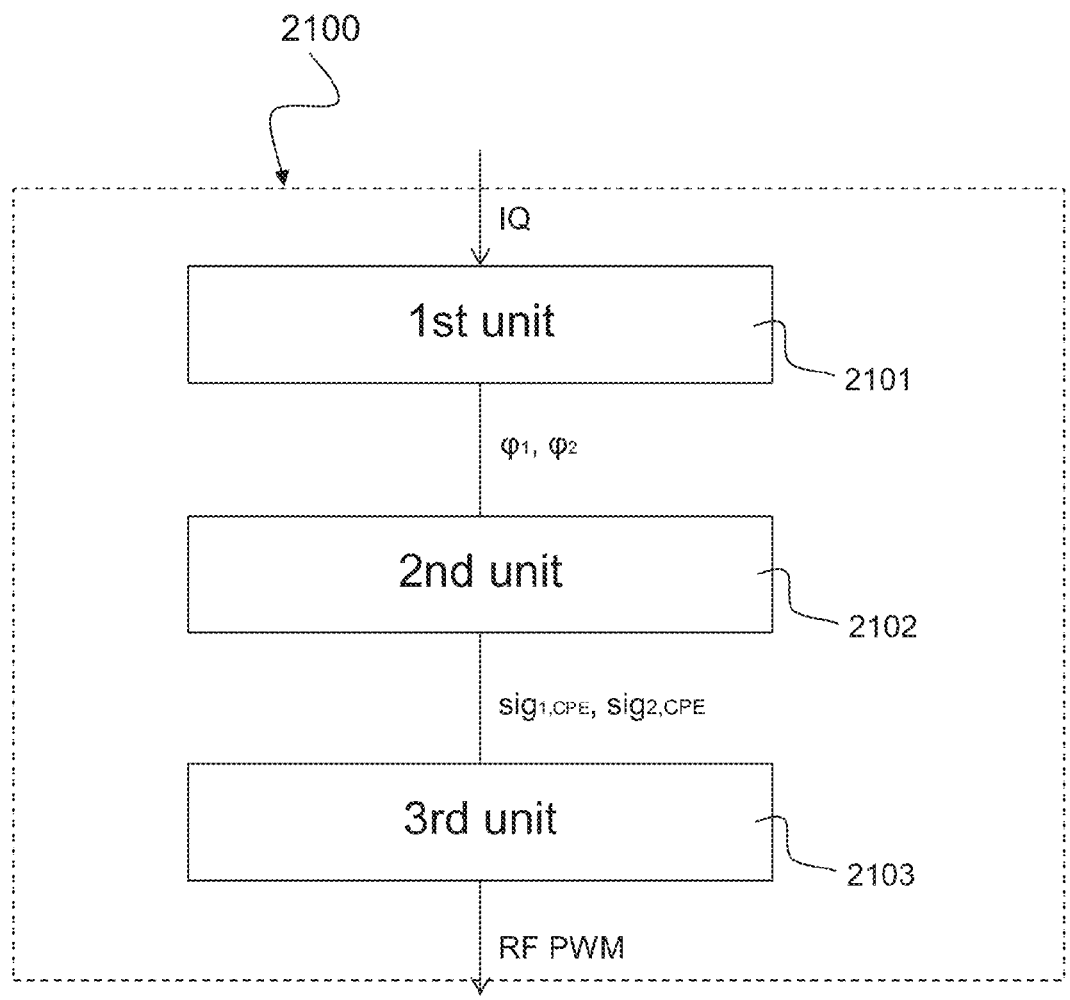
FIG. 21 is a block diagram illustrating a pulse-width modulation device in accordance with the disclosure.

FIG. 21 is a block diagram illustrating a pulse-width modulation device 2100 in accordance with the disclosure. The pulse-width modulation device 2100 may include a first unit 2101, a second unit 2102 and a third unit 2103.

The first unit 2101 may decompose an input IQ signal 102 having an amplitude and phase information into a sum of a first outphasing signal $\phi_1$ and a second outphasing signal $\phi_2$, e.g. according to the description with respect to FIG. 2 or with respect to FIG. 12. Each of the first outphasing signal $\phi_1$ and the second outphasing signal $\phi_2$ may have a constant amplitude and a time-varying phase.

Figure 16:
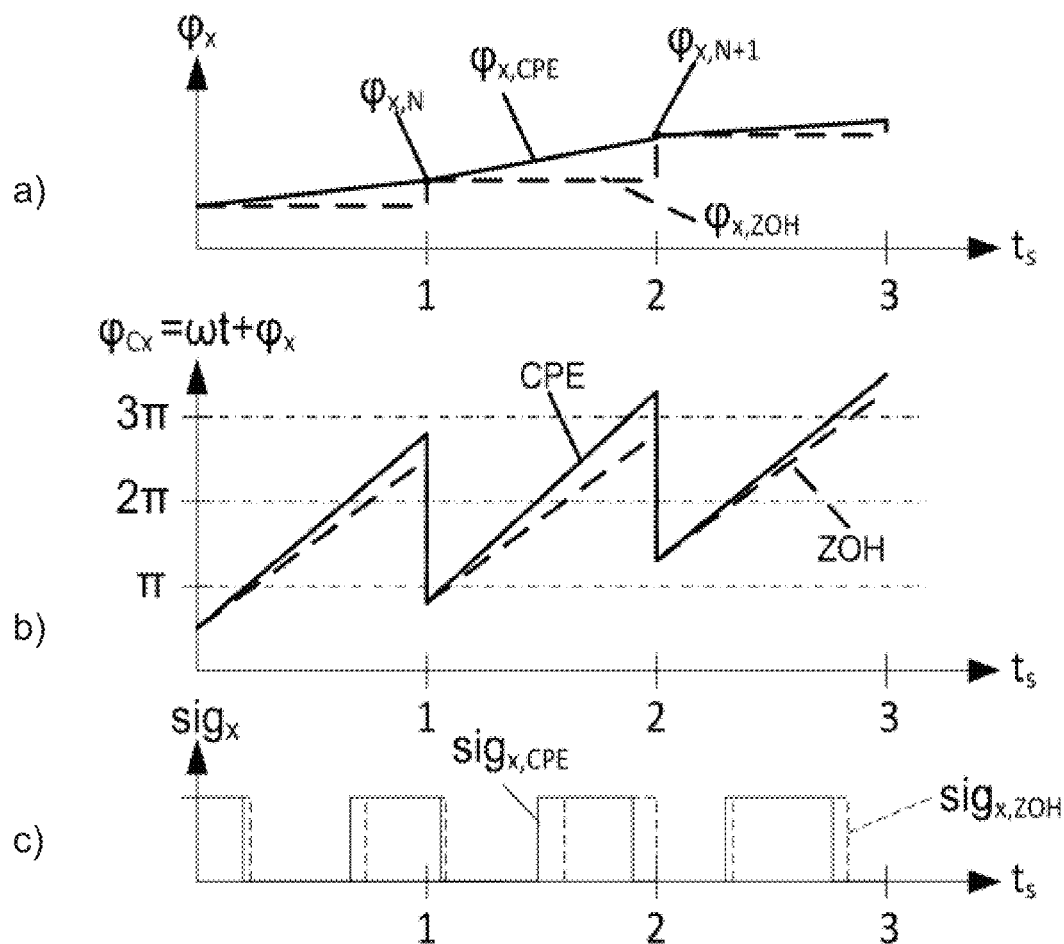
FIGS. 16a to 16c are schematic diagrams illustrating examples of the outphasing signal calculation in accordance with the disclosure.

The second unit 2102 may interpolate between a current sample and a subsequent sample of the first outphasing signal to provide a first cross point estimated outphasing signal $sig_{1,CPE}$, e.g. according to the description with respect to FIG. 2, 12 or 16. The second unit 2102 may interpolate between a current sample and a subsequent sample of the second outphasing signal to provide a second cross point estimated outphasing signal $sig_{2,CPE}$, e.g. according to the description with respect to FIG. 2, 12 or 16.

The third unit 2103 may provide a pulse-width modulated signal RF PWM 106 based on at least one of the first cross point estimated outphasing signal $sig_{1,CPE}$ and the second cross point estimated outphasing signal $sig_{2,CPE}$, e.g. according to the description with respect to FIGS. 1 and 8 to 16.

The modulation device 2100 may include a first pulse width modulation unit 207, e.g. according to the description of FIG. 2, to modulate a width of a pulse signal 211 with the first cross point estimated outphasing signal providing a first pulse-width modulated signal. The modulation device 2100 may include a second pulse width modulation unit 209, e.g. according to the description of FIG. 2, to modulate a width of the pulse signal 211 with the second cross point estimated outphasing signal providing a second pulse-width modulated signal. The modulation device 2100 may include a combining unit 213, e.g. according to the description of FIG. 2, to provide the pulse-width modulated signal 106 based on a combination of the first pulse width-modulated signal and the second pulse-width modulated signal. The third unit 2103 may provide the pulse-width modulated signal 106 having more than one pulse per carrier period, e.g. according to the description of FIG. 13. The second unit 2102 may provide the first cross point estimated outphasing signal and the second cross point estimated outphasing signal each comprising a main signal part $\phi_{1,main}$, $\phi_{2,main}$ and an auxiliary signal part $\phi_{1,aux}$, $\phi_{2,aux}$, e.g. according to the description of FIG. 12. A first pulse of the pulse-width modulated signal per carrier period may be provided based on the main signal part and a second pulse of the pulse-width modulated signal per carrier period may be provided based on the auxiliary signal part of at least one of the first cross point estimated outphasing signal and the second cross point estimated outphasing signal.

The modulation device 2100 may include a combining unit, e.g. a delta sigma modulator or a simple adder, to noise-shape the input signal by combining the main signal part and the auxiliary signal part of at least one of the first and the second cross point estimated outphasing signal.

The present disclosure presents a technique for reducing aliasing effects in digital RF-PWM (pulse width modulator) signal generation. Without Cross Point Estimation (CPE) and additional signal processing as described in this disclosure, the signal quality of a digital RF-PWM modulator may be limited by aliasing products due to the sampled nature of the signal generation. By generating the signal in an optimized way, this limitation can be strongly reduced.

The present disclosure further presents a technique for performing CPE on both, the amplitude signal and the phase signal. As the cross points of an RF-PWM signal may not only depend on the amplitude of the signal, but also on the phase signal, using these signals to provide a CPE may provide a highly accurate pulse width modulation technique. The disclosed techniques relate to solutions that are able to produce more than one (circular shifted) pulse per carrier period and therefore may not suffer from a limitation due to the sampled nature of the modulator.

Aspects of the disclosure relate to methods and devices that may perform CPE on the two outphasing signals that may be used for the RF-PWM signal generation and thus a near ideal RF-PWM signal may be calculated. Based on this ideal, i.e. CPE corrected, RF-PWM signal the optimum sample for the current period may be determined. In cases where more than one pulse per carrier period may be required, a second signal output may be generated by optimum sample determination. This second signal together with the optimum sample determination may enable a significant improvement in signal quality. The second signal output may either be fed to a second modulator branch, which may add the missing pulses or may be incorporated into some kind of delta sigma structure to reduce the signal to one branch.

Aspects of the disclosure relate to methods and devices that may provide optimum signal generation by means of cross point estimation and minimum error signal generation. The output of this optimum signal generation may feed two modulator branches to enable best mitigation of the aliasing effects or may be combined to one branch by means of a simplified kind of delta sigma modulation.

In addition, while a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term. "comprise". Furthermore, it is understood that aspects of the disclosure may be implemented indiscrete circuits, partially integrated circuits or fully integrated circuits or programming means. Also, the terms "exemplary", "for example" and "e.g." are merely meant as an example, rather than the best or optimal.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

What is claimed is:

1. A method for providing cross point information, the method comprising:
   providing an input signal comprising amplitude and phase information;
   interpolating between a first point of the input signal and a second point of the input signal to provide cross point information between the first point and the second point; and
   providing a pulse-width modulated signal based on the input signal and the cross point information.

2. The method of claim 1, further comprising:
   using the cross point information for compensating an error of the pulse-width modulated signal due to a sampling of the input signal.

3. The method of claim 1, wherein the first point comprises a first sample of the input signal and the second point comprises a second sample of the input signal.

4. The method of claim 1, further comprising:
   providing the second point of the input signal as a predicted version of the input signal based on the first point of the input signal.

5. The method of claim 1, wherein the first point and the second point of the input signal comprise contiguous samples of the input signal.

6. The method of claim 1, wherein the input signal is sampled at a carrier frequency of an oscillator signal.

7. The method of claim 6, further comprising:
providing the second point of the input signal based on inserting a time delay of at least one carrier period of the oscillator signal to the input signal.

8. The method of claim 1, further comprising:
providing the cross point information based on a linear interpolation between the first point of the input signal and the second point of the input signal.

9. A method for providing a pulse-width modulated signal, the method comprising:
decomposing an input signal comprising amplitude and phase information into a sum of a first outphasing signal and a second outphasing signal, wherein each of the first outphasing signal and the second outphasing signal comprises a constant amplitude and a time-varying phase;
interpolating between a current sample and a subsequent sample of the first outphasing signal to provide a first cross point estimated outphasing signal;
interpolating between a current sample and a subsequent sample of the second outphasing signal to provide a second cross point estimated outphasing signal; and
providing the pulse-width modulated signal based on at least one of the first cross point estimated outphasing signal and the second cross point estimated outphasing signal.

10. The method of claim 9, further comprising:
providing at least one of the subsequent sample of the first outphasing signal and the subsequent sample of the second outphasing signal based on inserting a time delay of at least one carrier period.

11. The method of claim 9, wherein providing the pulse-width modulated signal comprises:
modulating a first square-wave signal with the first cross point estimated outphasing signal to provide a first pulse-width modulated signal; and
modulating a second square-wave signal with the second cross point estimated outphasing signal to provide a second pulse-width modulated signal.

12. The method of claim 11, wherein providing the pulse-width modulated signal comprises:
combining the first pulse-width modulated signal and the second pulse-width modulated signal.

13. The method of claim 9,
wherein the interpolating between the current sample and the subsequent sample of the outphasing signals is based on linear interpolation.

14. The method of claim 9,
wherein the interpolating between the current sample and the subsequent sample of the outphasing signals is based on oversampling.

15. The method of claim 9, further comprising:
noise-shaping the input signal based on at least one of the first cross point estimated outphasing signal and the second cross point estimated outphasing signal.

16. A pulse-width modulation device, comprising:
a first unit configured to decompose an input signal comprising amplitude and phase information into a sum of a first outphasing signal and a second outphasing signal, wherein each of the first outphasing signal and the second outphasing signal comprises a constant amplitude and a time-varying phase;
a second unit configured to interpolate between a current sample and a subsequent sample of the first outphasing signal to provide a first cross point estimated outphasing signal and to interpolate between a current sample and a subsequent sample of the second outphasing signal to provide a second cross point estimated outphasing signal; and
a third unit configured to provide a pulse-width modulated signal based on at least one of the first cross point estimated outphasing signal and the second cross point estimated outphasing signal.

17. The pulse-width modulation device of claim 16, further comprising:
a first pulse width modulation unit configured to modulate a width of a pulse signal with the first cross point estimated outphasing signal providing a first pulse-width modulated signal;
a second pulse width modulation unit configured to modulate a width of the pulse signal with the second cross point estimated outphasing signal providing a second pulse-width modulated signal; and
a combining unit configured to provide the pulse-width modulated signal based on a combination of the first pulse width-modulated signal and the second pulse-width modulated signal.

18. The pulse-width modulation device of claim 16, wherein the third unit is configured to provide the pulse-width modulated signal comprising more than one pulse per carrier period.

19. The pulse-width modulation device of claim 16, wherein
the second unit is configured to provide the first cross point estimated outphasing signal and the second cross point estimated outphasing signal each comprising a main signal part and an auxiliary signal part, and
a first pulse of the pulse-width modulated signal per carrier period is provided based on the main signal part and a second pulse of the pulse-width modulated signal per carrier period is provided based on the auxiliary signal part of at least one of the first cross point estimated outphasing signal and the second cross point estimated outphasing signal.

20. The pulse-width modulation device of claim 16, further comprising:
a combining unit configured to noise-shape the input signal by combining the main signal part and the auxiliary signal part of at least one of the first and the second cross point estimated outphasing signals.

* * * * *

UNITED STATES PATENT AND TRADEMARK OFFICE
CERTIFICATE OF CORRECTION

PATENT NO. : 9,099,996 B2  
APPLICATION NO. : 14/079923  
DATED : August 4, 2015  
INVENTOR(S) : Seebacher et al.

It is certified that error appears in the above-identified patent and that said Letters Patent is hereby corrected as shown below:

On Title Page, References Cited (56), Other Publications, (Column 2, line 8) of the printed patent, please change "Jounal" to --Journal-- after IEEE.

Signed and Sealed this  
Ninth Day of February, 2016

Michelle K. Lee  
*Director of the United States Patent and Trademark Office*